United States Patent [19]

Wilson et al.

[11] Patent Number: 4,641,244
[45] Date of Patent: Feb. 3, 1987

[54] METHOD AND APPARATUS FOR REGISTERING COLOR SEPARATION FILM

[75] Inventors: Monti R. Wilson, Overland Park, Kans.; Victor E. Hutchison; William J. Bendure, both of Kansas City, Mo.; Frederick W. Anderson, Olathe, Kans.

[73] Assignee: Opti-Copy, Inc., Lenexa, Kans.

[21] Appl. No.: 720,255

[22] Filed: Apr. 5, 1985

[51] Int. Cl.$^4$ .............. G06F 15/46; G06F 15/66; H04N 7/18; H04N 1/40

[52] U.S. Cl. .................... 364/475; 364/525; 364/559; 358/101; 358/107; 358/283; 382/8; 382/52; 382/54; 83/701

[58] Field of Search ............... 364/475, 463, 524, 525, 364/559; 358/101, 107, 283, 93; 382/1, 8, 42, 44–46, 50, 52, 54; 83/30, 33, 13, 701

[56] References Cited

U.S. PATENT DOCUMENTS

| | | | |
|---|---|---|---|
| 4,272,812 | 6/1981 | Svensson | 364/475 |
| 4,325,077 | 4/1982 | Dunham | 358/101 X |
| 4,390,955 | 6/1983 | Arimura | 364/559 X |
| 4,394,693 | 7/1983 | Shirley | 358/283 X |
| 4,424,588 | 1/1984 | Satoh et al. | 358/107 X |
| 4,462,046 | 7/1984 | Spight | 358/101 |
| 4,475,122 | 10/1984 | Green | 358/107 X |
| 4,481,533 | 11/1984 | Alzmann et al. | 364/475 X |
| 4,596,037 | 6/1986 | Bouchard et al. | 358/101 X |

FOREIGN PATENT DOCUMENTS

83/00440 3/1983 PCT Int'l Appl. ............ 382/54 X

OTHER PUBLICATIONS

Register Stripping Robot-brochure by Fujimac Trading Co., Ltd.

Primary Examiner—William B. Perkey
Attorney, Agent, or Firm—Kokjer, Kircher, Bradley, Wharton, Bowman & Johnson

[57] ABSTRACT

A method and apparatus for registering the halftone color separation films used in color picture processing. A digital picture is taken of two register points on each separation film, and the pictures (which may contain register marks) are analyzed by algorithmic processes in order to calculate the movement necessary to register the halftone picture details (or register marks). Based on the calculations, the films are punched to provide a pair of register holes in each film at locations which result in registration when the register holes are aligned on register pins during the final reproduction process. The algorithmic process involves determining the halftone screen angle, average interdot spacing and fractional area occupied by each halftone dot within its halftone cell and using this data to construct a continuous tone picture. Interpolation techniques are used to interpolate the continuous tone picture to a registration picture which is a 150 line screen picture square with the raw data picture. Edge enhancement and tone normalization algorithms are used prior to registration. The final machine movements to achieve registration are computed from an algorithm that registers all points of the pictures from translational move data at two points.

46 Claims, 23 Drawing Figures

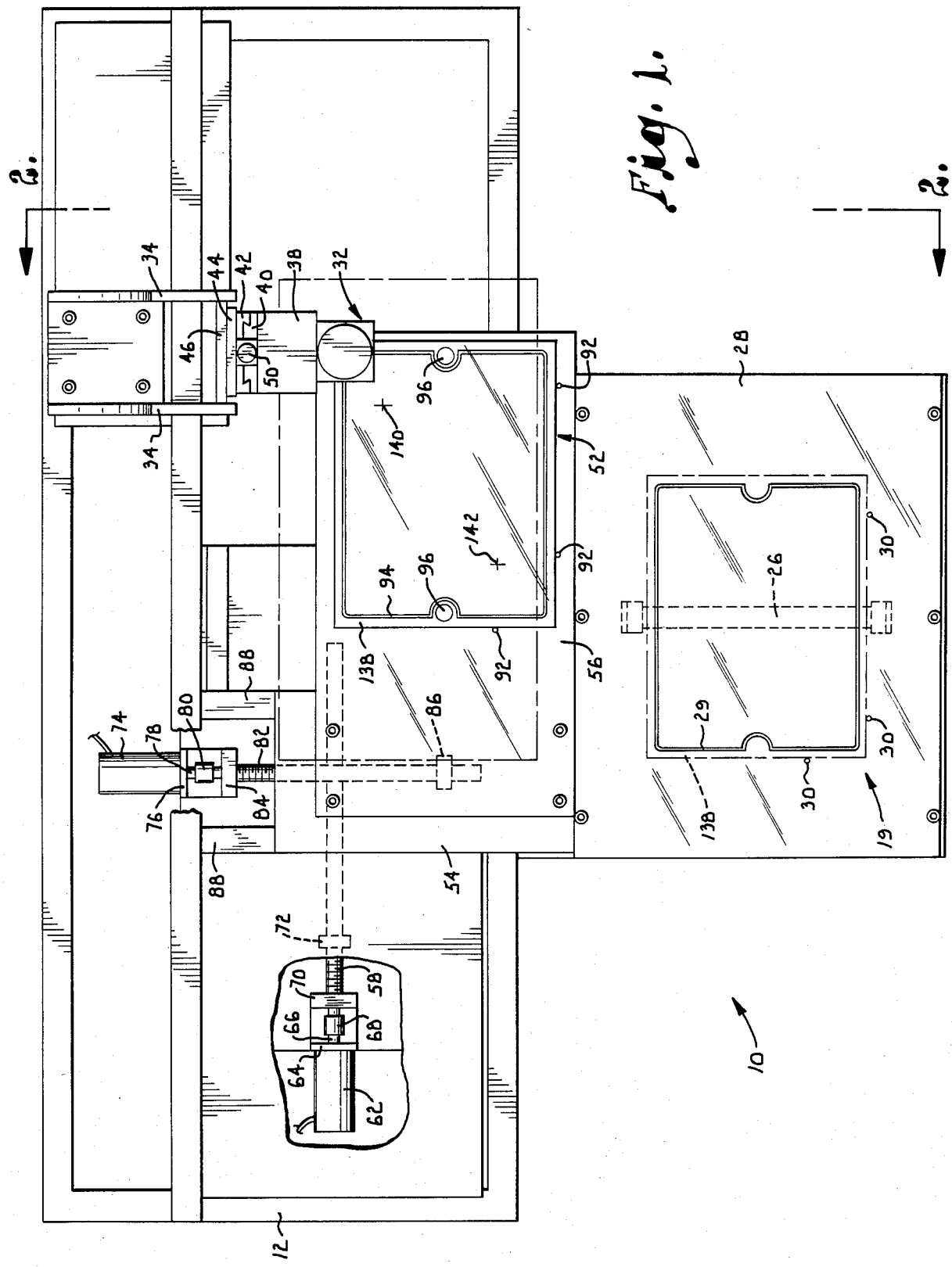

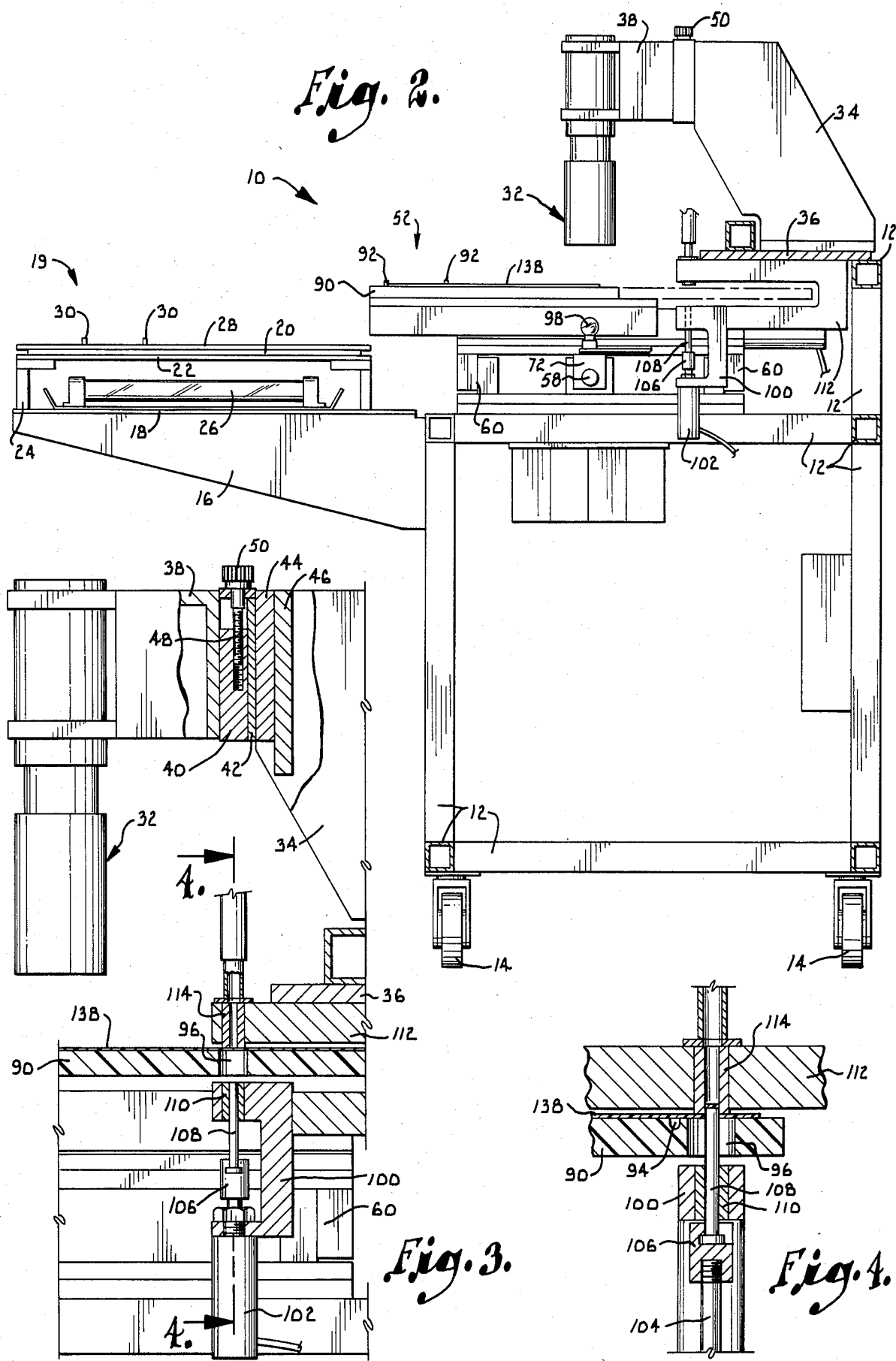

METHOD AND APPARATUS FOR REGISTERING COLOR SEPARATION FILM

BACKGROUND OF THE INVENTION

This invention relates in general to the field of graphic arts and more particularly to the registration of halftone color separation film. Still more particularly, the invention is directed to a method and apparatus for obtaining highly accurate registration of color separation films in order to permit printing of high quality color pictures.

In the printing of high quality color photographs such as those which appear in mass circulation magazines and other publications where quality is of overriding importance, the color original is broken down into separate photographic images that are processed separately. The printed picture is a halftone picture in which the appearance of continuous tones is realized by breaking the picture detail up into halftone dots of varying sizes. In the commonly used four color process, the halftone color separations are four in number. Each color separation carries black and white tone information that reflects the process color content of the original color picture. The final reproduction requires that the four halftone color separation films be precisely registered or aligned so that the printed picture faithfully reproduces the original.

At present, process color registration is for the most part performed manually by highly trained persons referred to in the printing industry as strippers. The manual registration process involves taping or stripping the separation films (negatives or positives) to carrier sheets which are usually clear polyester film. The first reference color film is stripped to a pre-punched carrier sheet which is often the size of 4, 8, 16 or 32 pages. The film with the second color image is applied to a second overlaid prepunched carrier sheet, is visually aligned or registered with the first separation film, and is then stripped to the second carrier in the registered position. The third and fourth separation films are registered with the others by following the same procedure. Holes which are pre-punched in the carrier sheets are placed on a pair of register pins in the contact frame to maintain the registration for the final reproduction.

The manual procedure for registering color separation films is subject to a number of shortcomings, mostly relating to accuracy. It is necessary for the stripper to register the separations to within a fraction of a row of halftone dots in each case, and this high degree of accuracy is difficult to obtain by even the most skilled and experienced strippers. In high quality printing, there are usually about 150 halftone dots per inch, and the center to center dot spacing is less than 7 mils. As can easily be appreciated, human error inevitably results from time to time, and poor quality picture reproduction often occurs. If an unacceptable registration is not discovered until press time, it is necessary to hold up the presses until the error is corrected. Press delays due to registration errors are inordinately expensive events which are to be avoided if at all possible.

Manual registration is also a tedious and time consuming process which is highly labor intensive. Typically, registration of four color separations requires between 9 and 20 minutes for a highly skilled and highly paid stripper to perform. Consequently, the labor costs contribute significantly to the overall costs. Consistency and reliability are also lacking because the quality of the registration is highly dependent upon the skill and vision of the individual stripper, and these can vary considerably. Even the same stripper cannot maintain the same level of accuracy from one job to the next due to the variations that are inherent in human performance capabilities.

Registration aids are sometimes used to magnify the halftone dot detail, but aids of this type add little to the accuracy. When a small portion of a halftone picture is magnified, it appears to the human eye to be a random collection of halftone dots rather than a recognizable picture. Therefore, picture details are often extremely difficult to align and this problem is aggravated by the difficulty the stripper has in making controlled muscle movements when viewing a magnified picture. A shaky hand or tired eyes can destroy registration, and this tendency increases with magnification. For these reasons, magnification aids are of limited utility and have not solved the problems that are inherent with manual registration.

In recent years, machines have been developed to either aid or replace the manual registration procedure. One machine is an optical-mechanical device having mechanical arms for movement of the carrier sheets and a magnified optical display for aiding the worker who performs the registration. Picture detail can be used as the basis for the registration, or special marks known as register marks can be used. The register marks are typically cross hairs located outside the field of the picture. Whether picture detail or register marks are used, this machine still relies on human skill and vision and is thus subject to many of the same problems that are associated with the strictly manual registration procedure.

Two other known machines rely on the register marks entirely in order to achieve registration. One of these machines is an electro-mechanical device having an electro-optical sensor which detects the centers of the register marks. Based on the information obtained by the sensor, the mechanical device moves one film into register with the other and then punches holes in the carrier sheets. The other machine is essentially a stripping robot that functions much like the electro-mechanical machine but tapes the separation films onto a prepunched carrier rather than acting to punch the holes itself. The basic problem with both of these latter two machines is that they rely wholly on the register marks to obtain registration. If the register marks are inaccurate, registration is also inaccurate. It is not uncommon for the register marks to be destroyed when the films are trimmed or otherwise processed, and missing registration marks render these machines completely useless. The register marks are also inaccurate at times, and this too destroys the accuracy of registration.

SUMMARY OF THE INVENTION

The present invention is directed to a method and apparatus for registering halftone color separation films in a highly accurate and consistent manner without the problems associated with manual stripping and the machines that have been available in the past.

In accordance with the invention, digital image data is acquired from the color separation films and is used in correlating the images to calculate the positions at which registration occurs between the separations. Registration holes are punched in polyester carrier sheets on which the film separations are mounted, and the locations of the holes are accurately computed so that the separations register when the final reproduction is performed. The machine is computer directed and its movements are controlled by the results of algorithmic, digital computations based on the digital image information extracted from the pictures and/or register marks by a high resolution digital camera.

In carrying out the registration process, one of the separation films is arbitrarily selected as a reference film and is stripped to a clear unpunched polyester carrier sheet. The other films are then roughly aligned with the reference and are stripped to their own unpunched carrier sheets in the roughly aligned positions. The operator of the machine then places the reference carrier on the machine on a digitizer tablet and uses a digital cursor to select a pair of register points which are preferably either register marks or detailed areas of the halftone film. Then, the reference carrier is placed on a movable chase which moves the two register points in sequence beneath the digital camera. The camera records digital pictures of the areas surrounding the register points. The data which is extracted by the camera is transferred to a high speed array processor which is well suited to carry out high speed algorithmic calculations. The remaining films are then placed in succession on the movable chase, and the camera records digital pictures at locations which approximately correspond to the locations selected by the cursor but which are slightly offset by reason of the fact that the films are only roughly registered initially.

If the digital pictures contain register marks, a unique algorithm is used to find the centers of the register marks for purposes of registration. If one or both pictures include halftone dot detail, algorithmic computations are used to construct registration pictures from the data extracted from the pictures. On the basis of the registration pictures, computations are made to calculate the movement that is necessary to register the two images of each film with the corresponding images of the reference film. Using this data, the registration holes are punched in each carrier sheet at proper locations to assure that all of the films register when subsequently applied to register pins during the final reproduction process.

Film registration performed in accordance with the invention is improved in a number of significant aspects in comparison to registration carried out according to prior art techniques. The use of high speed computations combined with the speed of the mechanical motions allows much faster registration than is possible with the manual method. The operator need not be particularly skilled because all that is required is a rough initial registration which can be quickly and easily performed by unskilled personnel. Another highly important advantage of the present invention is that registration is consistently accurate to within one fourth row of dots or better and is not subject to the variations that are inherent in manual registration. The machine can repeatedly perform accurate registration and is not plagued by human error and human performance variations.

It is also of particular importance that the present invention can achieve accurate registration without the need to rely on register marks. While register marks can be used, they are not necessary and the machine can work from picture detail if register marks are inaccurate or altogether missing. This is a significant advantage over other machines, all of which rely either on human accuracy or accurate registration marks or both. Because human vision is not relied upon other than to achieve an initial rough registration, human error does not present a problem and the reliability of the registration is high enough to virtually eliminate the costly problems of restripping and press down time due to registration errors.

DESCRIPTION OF THE DRAWINGS

In the accompanying drawings which form a part of the specification and are to be read in conjunction therewith and in which like reference numerals are used to indicate like parts in the various views:

FIG. 1 is a top plan view of a digital registration machine constructed according to a preferred embodiment of the present invention, with some components shown in broken lines and portions broken away for purposes of illustration;

FIG. 2 is a sectional view taken generally along line 2—2 of FIG. 1 in the direction of the arrows;

FIG. 3 is a fragmentary sectional view on an enlarged scale showing the digital camera and mechanical punch which are included in the machine;

FIG. 4 is a fragmentary sectional view on an enlarged scale taken generally along line 4—4 of FIG. 3 in the direction of the arrows;

FIG. 19 is a diagrammatic illustration depicting the convolution geometry used for preregistration edge enhancement of the registration pictures;

DETAILED DESCRIPTION OF THE INVENTION CONSTRUCTION OF THE MACHINE

Figure 5:
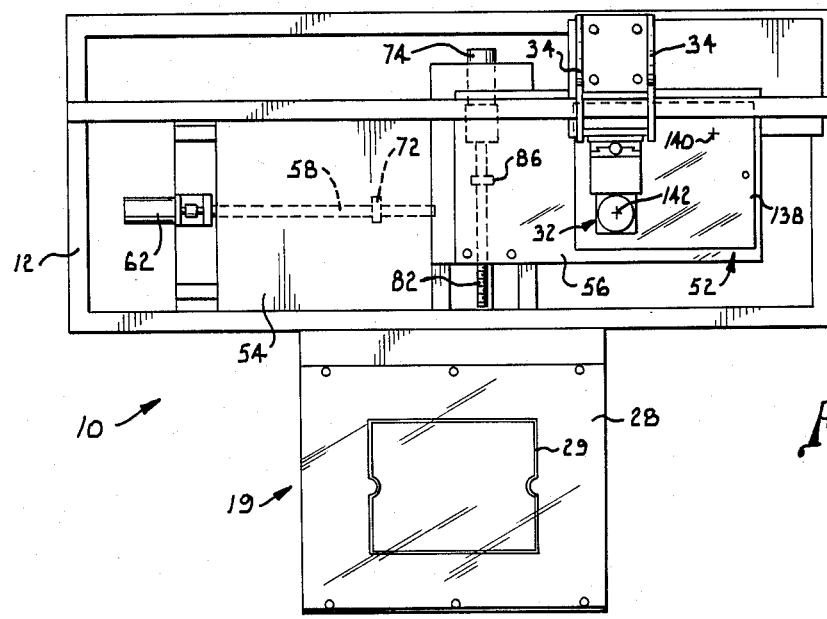
FIG. 5 is a top plan view on a reduced scale showing the movable chase of the machine in position for recording of the image at one registration point centered beneath the camera.
Figure 6:
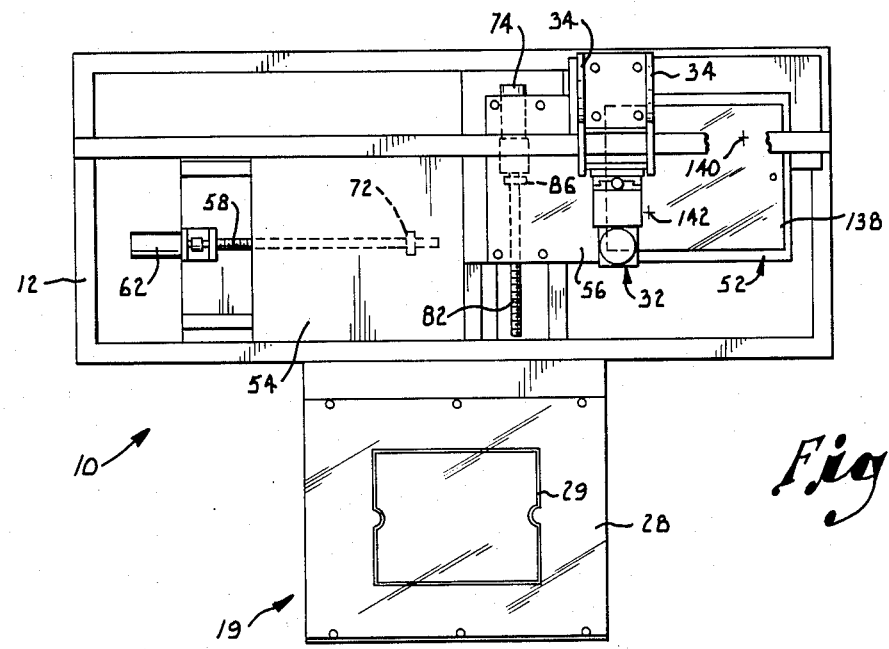
FIG. 6 is a top plan view similar to FIG. 5, but showing the chase in position for punching of one of the registration holes.

Referring now to the drawings in more detail and initially to FIGS. 1–6, numeral 10 generally designates a film registration machine constructed in accordance with a preferred embodiment of the present invention. The machine 10 has a rigid frame which is formed by a plurality of interconnected square tubes 12. A plurality of caster wheels 14 are connected with the lower frame members 12 to permit the machine to be easily moved. Extending forwardly from the frame of the machine are brackets 16 on which a horizontal table 18 is mounted. The table 18 supports digitizer tablet assembly which is generally designated by numeral 19. A digitizer tablet 20 rests on a transparent plate 22 forming the top of an enclosure 24 which is illuminated by a light bulb 26 located within the enclosure and below the digitizer tablet 20. Overlying the digitizer tablet is a transparent plate 28 having a vacuum channel 29 and three upwardly projecting alignment pins 30.

The digitizer tablet 20 is a conventional device which registers and records locations selected by a cooperating hand held cursor (not shown). When the cursor is aligned with a selected location over the digitizer tablet 20 and activated, the digital location of the selected point is registered. Preferably, the cursor has a resting place on a cradle, and the vacuum channel 29 is deactivated when the cursor is in place on its cradle. However, when the cursor is removed from the cradle, the vacuum is automatically applied to channel 29 in order to hold plastic carrier sheets for the films down on the plate 28, as will be described more fully.

A digital camera 32 is mounted in a fixed position on the frame of the machine. The camera 32 is preferably a line scan CCD (charge couple device) digital camera having a stepping motor for causing the camera to linearly scan the elements of the pictures which are recorded by the camera. Preferably, the camera records 640×640 pixel digital pictures, with each pixel being 13 microns square. The stepping motor for the camera is controlled by a microprocessor.

The digital camera 32 is mounted on a pair of brackets 34 which are bolted or otherwise secured to a horizontal mounting plate 36. The mounting plate is in turn supported on the frame of the machine. The camera 32 is carried on a bracket 38 which connects with a dovetail 40. The dovetail fits in a vertical dovetail groove formed in a block 42 which is connected with the mounting brackets 34 by a pair of plates 44 and 46. An adjustment screw 48 is threaded into the dovetail 40 and carries a knob 50 to facilitate adjustment of the screw. Due to the threaded connection between screw 48 and the dovetail 40, turning of knob 50 causes the dovetail to move up and down in the dovetail groove in order to raise and lower the digital camera 32.

A movable chase 52 is carried on a positioning table assembly formed by one table 54 which is restricted to movement in the "x" direction and another table 56 which is restricted to movement only in the "y" direction. The x table 54 is moved by a drive screw 58 and is restricted to linear movement by guide bearings 60. The drive screw 58 is turned by a reversible electric motor 62 which is attached to a mounting plate 64 and which drives an output shaft 66. A coupling 68 connects the output shaft 66 with the drive screw 58, and a bearing 70 supports the drive screw for rotation. The drive screw 58 is threaded through a nut 72 secured to the x table 54 such that turning of the drive screw in opposite directions moves table 54 linearly in opposite directions.

The y table 56 is driven similarly with its motion restricted to a direction perpendicular to the direction of motion of the x table 54. A reversible electric motor 74 mounted on a plate 76 has an output shaft 78. Shaft 78 is coupled at 80 to a drive screw 82 which is supported to rotate by a bearing 84. Screw 82 is threaded through a nut 86 secured to the y table 56. Guide bearings 88 restrict the y table 56 to linear movement.

The movable chase 52 includes a transparent plastic plate 90 having three upstanding alignment pins 92 which serve to properly locate the carrier sheets which are placed on the chase. The plate 90 also has a vacuum channel 94 for holding of the carrier sheets down on top of the chase when vacuum is applied. Plate 90 is provided with a pair of holes 96 which permit the carrier sheets to be punched in a manner that will be explained in more detail. A DC light bulb 98 is located immediately below camera 32 in order to provide illumination during recording of pictures.

Punching of the carrier sheets is effected by a punch mechanism which is mounted on a C-shaped bracket 100. The punch bracket 100 is suitably mounted on the frame at a location below the camera mounting 34. The punch mechanism includes a pneumatic cylinder 102 which is secured to the lower arm of bracket 100 and which has an extendable and retractable rod 104. A spool 106 is threaded onto the top end of the rod 104, and a punch 108 is detachably carried by the spool 106. The punch 108 has a head which can be fitted into a slot formed in the spool in order to maintain the punch in position.

The punch 108 extends through a bushing 110 which is carried by the upper arm of the bracket 100. A C-frame 112 has its upper arm located above bracket 100 so that the transparent plate 90 can be extended between bracket 100 and the C-frame 112 during the punching operation, as best shown in FIGS. 3 and 4. A die 114 is carried on the C-frame 112 and is aligned directly above bushing 110 such that the top end of the punch 108 enters sleeve 114 when the punch is extended as shown in FIG. 4. It should be noted that more than one punch can be provided if desired.

Figure 7:
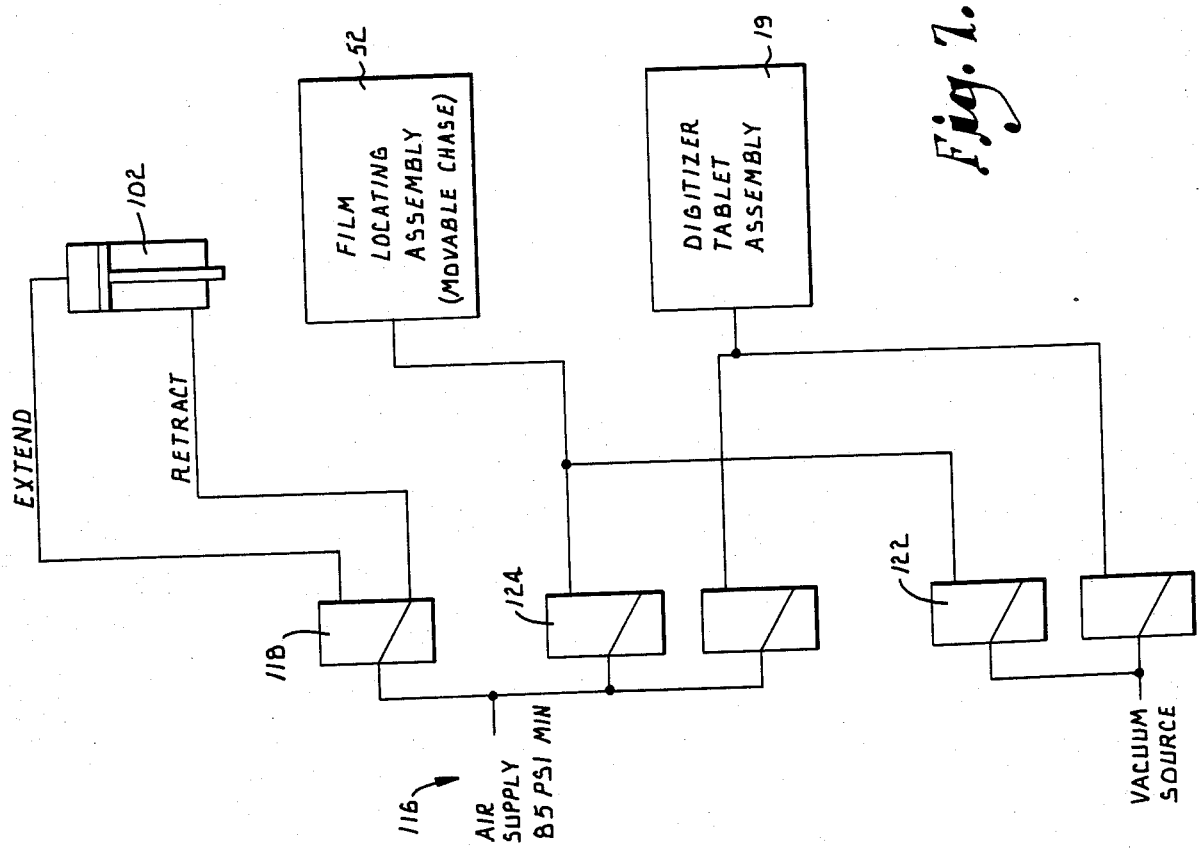
FIG. 7 is a schematic circuit diagram of the pneumatic system of the machine.

FIG. 7 shows the pneumatic system which controls the application of air and vacuum to the various components of the machine. A suitable air supply 116 connects through a solenoid valve 118 with the extend and retract sides of the punch cylinder 102. When valve 118 is in the position shown in FIG. 7, the air supply 116 is connected with the retract side of cylinder 102 and the cylinder is retracted to the position shown in FIG. 3. However, when the valve 118 is shifted, the air supply 116 connects with the extend side of cylinder 102 and the cylinder is extended to the position of FIG. 4 to punch one of the film carrier sheets.

A suitable vacuum source 120 connects through a solenoid valve 122 with the vacuum channels 29 and 94 for the digitizer tablet assembly 19 and the movable chase 52. When valve 122 is shifted from the position shown in FIG. 7, vacuum is applied to the vacuum channels in order to hold down any carrier sheets that are then in place on the digitizer tablet 20 or the movable chase 52. The air supply 116 may also be connected with channels 29 and 94 through a solenoid valve 124. Valve 124 is normally in the position of FIG. 7 and then disconnects the air supply from the vacuum channels. However, when valve 124 is shifted, air under pressure is applied to the vacuum channels to eject any carrier sheets that are in place on the digitizer tablet or movable chase.

Figure 8:
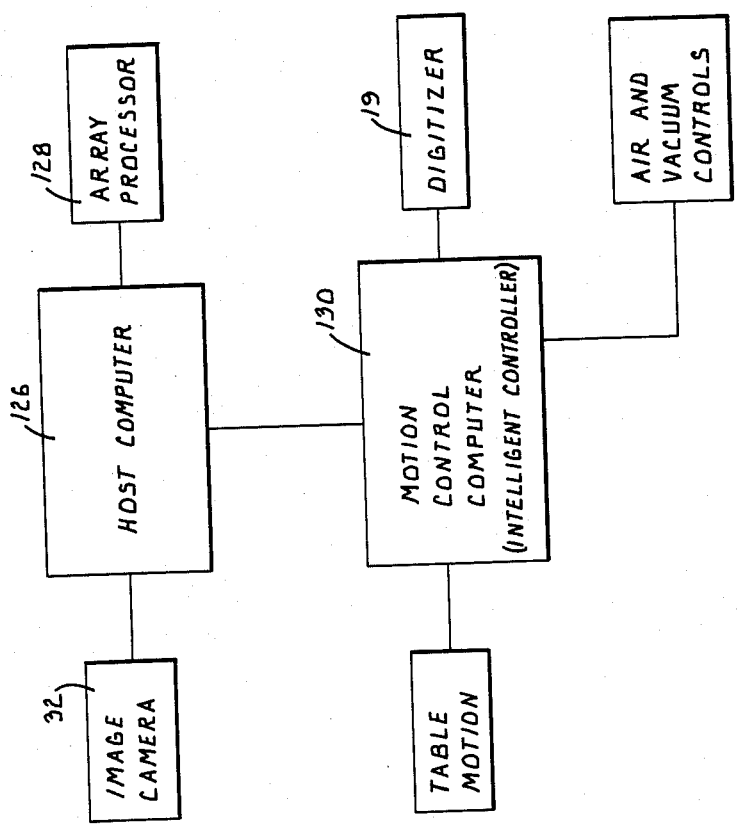
FIG. 8 is a simplified block diagram of the control components which control the operation of the machine.

FIG. 8 is a simplified block diagram of the control components used to control the registration process which is carried out by the machine 10. A host computer 126 supervises the recording and the intermediate storage of digital pictures recorded by the camera 32. The host computer also supervises the transfer of the digital picture data into a high speed array processor 128 which is a specialized computer having the ability to quickly perform the necessary numerical computations. A programmed microprocessor serves as an intelligent controller 130 which receives commands from the host computer and controls the drive motors 62 and 74 for the positioning tables 54 and 56. The intelligent controller 130 also controls the air and vacuum and receives data from the digitizer tablet 20 as to the locations which are selected thereon by the cursor.

Figure 9:
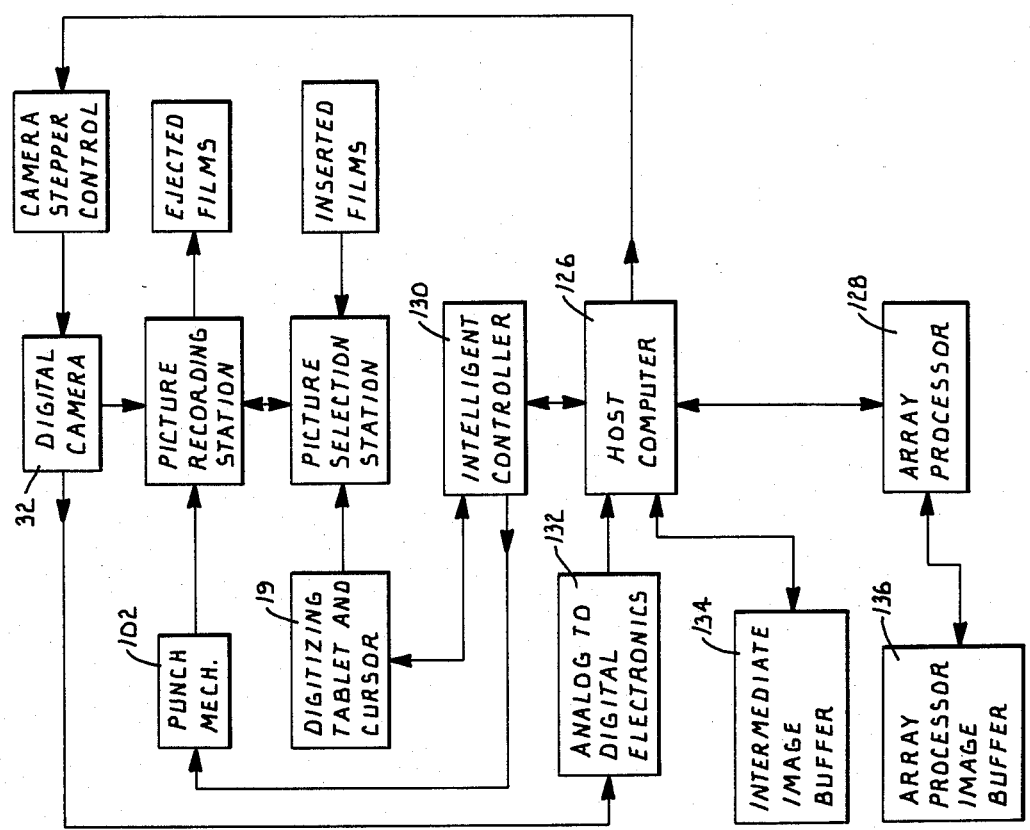
FIG. 9 is a somewhat more detailed block diagram of the control components of the machine.

FIG. 9 is a more detailed block diagram of the control components of the machine. As shown, the host computer 126 controls the stepping motor for the digital camera 32 and receives digital image data from the camera via an analog to digital electronics block 132. The host computer 126 has an intermediate image buffer 134 which is a high speed memory on the Q bus of the host computer. Under program control, the data is transferred from the intermediate image buffer 134 into the extended memory 136 of the array processor 128. The image data are transferred in four kilobyte packets. The recall of the array processor memory 136 is considerably faster than that of the intermediate image buffer 134. The direct memory access transfer is accomplished by the technique of double buffering in the array processor 128. The double buffering technique involves processing of one buffer in the array processor while the other buffer is being filled by the host computer. The process cycles back and forth between buffers, thereby overlapping the array processor processing time with the data transfer time from the host computer to the array processor. This is a form of pipelining.

OPERATION OF THE MACHINE

The machine 10 operates to register process color films such as the four halftone color separations used in the four color process which is commonly used in the reproduction of high quality color photographs. The operator of the machine first arbitrarily selects one of the process color films as a reference, and the reference film is taped or otherwise mounted to a clear unpunched polyester carrier sheet such as the sheet 138 which is shown in the drawings in place on the chase 52. The other three separation films are similarly taped or mounted on unpunched polyester carrier sheets in rough register with respect to the reference film when all of the carrier sheets are arranged in alignment. The purpose for the rough register is to eliminate gross rotational alignment error, and it is necessary only to place the separation films in register within approximately five rows of halftone dots (about 33 mils) in translational alignment at any point on the film.

The operator then places the reference carrier over the digitizer tablet 20 located at the picture selection station. Two edges of the carrier sheet are positioned against the three alignment pins 30, as shown in the phantom view of the carrier sheet 138 in FIG. 1. The operator then raises the cursor off of its cradle in order to activate the vacuum channel 29 in plate 28, thereby holding the carrier sheet 138 in place by suction.

The operator uses the cursor to select two spaced apart register points on the film which is carried on sheet 138. Either or both of the register points can be the approximate center of a register mark which is usually in the form of a hairline cross located outside the boundary of the picture. However, if register marks are not present on the film or are present but considered to be inaccurate, areas containing halftone dot detail can be selected for one or both register points. Ordinarily, areas of the picture which contain considerable detail are selected. When the first register point 140 has been selected, the cursor is placed at the first register point on the digitizer tablet 20, and the number one cursor button is depressed to record the location of the first register point. The digitizer tablet 20 then transmits the location to the host computer. The second register point 142 is thereafter selected and recorded in the host computer by aligning the cursor with it and depressing the number two button on the cursor.

After both register points 140 and 142 have been selected, the operator returns the cursor to its cradle, thereby releasing the vacuum at channel 29. The reference carrier sheet 138 is then moved by the operator from the digitizer tablet onto the movable chase 52. Two edges of the carrier sheet 138 are positioned against the alignment pins 92, as best shown in FIG. 1, and a foot switch or another switch is activated to apply vacuum to the vacuum channel 94. The vacuum thereafter holds the carrier sheet 138 in place against the alignment pins 92. At this time, the movable chase 52 is in the load/unload position shown in FIG. 1.

The machine then begins automatic operation initiated by the closing of a door on the carrier sheet 138 or by activation of another switch. Under the control of the intelligent controller 130, the positioning table drive motors 62 and 74 are activated to move chase 52 until the first register point 140 is centered immediately below the camera 32. The camera records a digital picture of the area of the film centered at the register point 140, and the picture data are transferred to the host computer 126 and analyzed by the array processor 128 using high speed algorithms which will be described in more detail.

The motors 62 and 74 are then activated again to align the second register point 142 with the lens of the digital camera 32. The digital camera records a picture centered at point 142, and the data in the picture are transferred to the host computer and analyzed by the array processor 128. The chase 52 is then moved until the hole 96 near its right edge is centered above the punch 108. The punch mechanism is activated by the intelligent controller, and cylinder 102 is extended to punch a register hole in the carrier sheet 138 for the reference film. After the punch has been retracted, the chase is shifted until the hole 96 near its left edge is centered above the punch, and the punch is then activated again to punch a second register hole in the reference carrier sheet 138. When the punching operation has been completed, the movable chase 52 is returned to the load/unload position shown in FIG. 1, and the vacuum is removed so that the reference carrier sheet 138 can be removed by the operator (or automatically ejected if desired).

After the reference film has been removed from chase 52, the carrier sheet for the second film is placed on the chase with its edges against the alignment pins 92. The vacuum channel 94 is then activated and automatic operation of the machine is initiated. The chase 52 is moved until the location on the second carrier sheet corresponding to point 140 is centered beneath the camera 32. The camera records a picture, transfers the picture data to the host computer, and the data are analyzed by the high speed array processor 128. The chase is then moved to center a second point which corresponds with the register point 142 beneath the camera 32. Another picture is recorded and analyzed by the array processor 128.

By using the algorithmic processes to be explained hereinafter, computations are made based on the picture data to provide the locations at which the second carrier sheet must be punched in order to effect registration of the second film with the reference film. Based on these calculations, the chase 52 is properly positioned relative to punch 108 such that the two punched holes made in the second carrier sheet, when aligned with the punched holes in the reference carrier sheet, result in alignment between the second film and the reference film. After these two register holes have been punched in succession in the second carrier sheet, chase 52 is returned to the load/unload position, the vacuum is released, and the second carrier sheet is removed by the operator or ejected from the chase.

The carrier sheets which hold the third and fourth color separation films are handled in the same manner as the second carrier sheet. When all of the register holes have been punched (two in each carrier sheet), the four carrier sheets can be "laid up" on register pins with assurance that the four color separation films are in registration for final reproduction of the color photograph. Because the films are initially only in rough alignment, the picture detail recorded at each register point is somewhat out of registration but can be used in the algorithmic process to achieve exact registration.

THE ALGORITHMIC PROCESS

Figure 10:
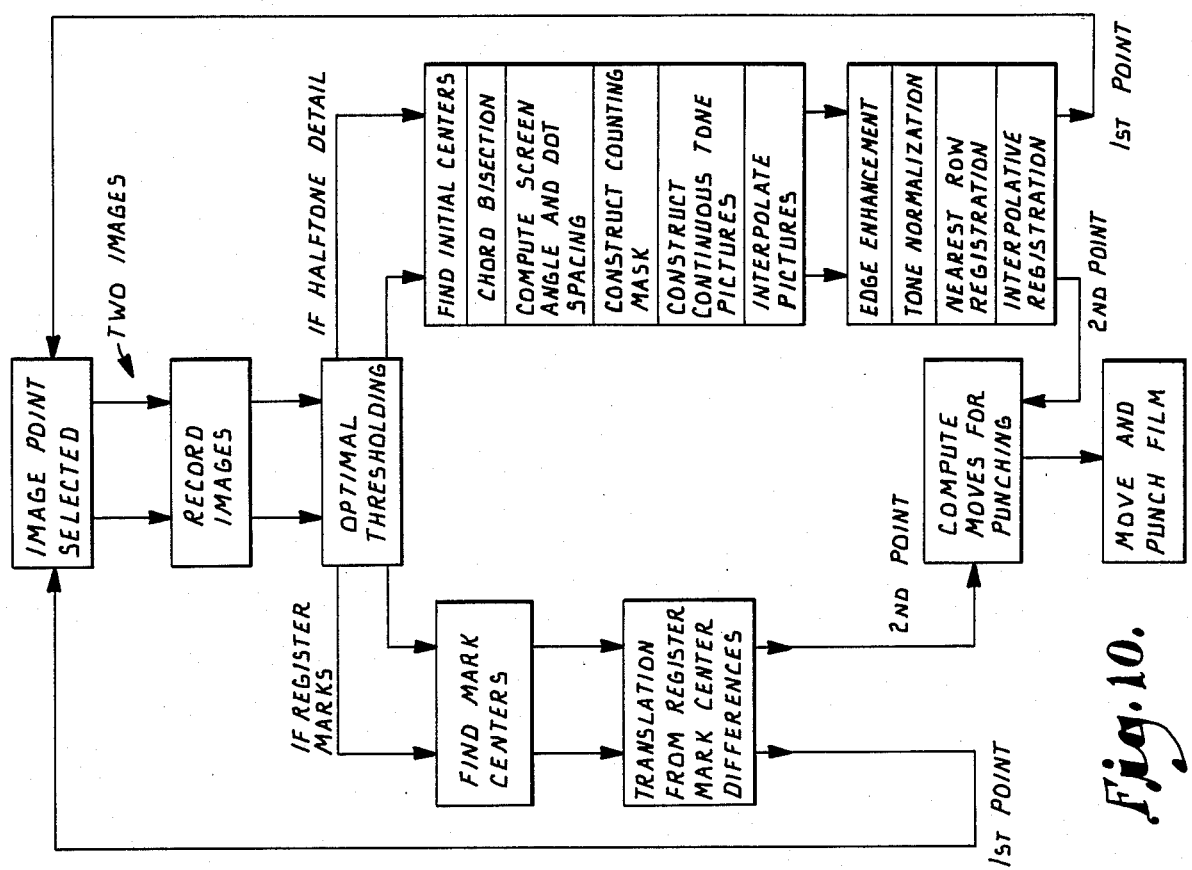
FIG. 10 is a flow chart for the algorithmic process which is performed by the machine to effect registration of halftone color film separations.

FIG. 10 is a flow chart which depicts the algorithmic processes that are carried out by the registration machine 10. After each image or register point has been selected, the camera 32 records an image centered at the selected register point. The digital camera is calibrated to 1:1 magnification. Each picture element or pixel of the digital picture recorded by the camera is square and is 13 microns on a side (about 0.51 mil). The raw data picture recorded by the camera is approximately 640×640 pixels and is centrally located in the field of view of the camera in order to achieve maximum image quality. First, an entire scan of the image is acquired, and the intermediate image buffer 134 is filled with data. As previously indicated, direct memory access transfer of the data to the array processor memory 136 is accomplished by double buffering in the array processor to achieve the highest possible speed.

The Optimal Thresholding Algorithm

The raw data image recorded by the camera 32 is in shades of gray, ranging from 0 (black) to 255 (white). In order to distinguish a register mark or halftone dot pixel from the background, optimal thresholding is performed to reduce the raw data picture to a binary or two level picture, where black is tone "one" and white is tone "zero". This facilitates the location of the centers of register marks and also facilitates the counting of black pixels within each halftone cell. The technique for performing optimum thresholding is well known to those skilled in the art (see *Digital Image Processing* by Gonzales and Wintz, 1977, p. 327) and involves first obtaining an estimate for the threshold by averaging the maximum and minimum tones. This initial threshold separates white from black. (Numbers above or equal to the threshold are considered white and those below the threshold are considered black). Then, the average black and average white tones are found. The optimum threshold is the average of the average black and average white tones. A final thresholding is performed with the optimum threshold determined by this procedure. Thresholding is performed row by row in the raw data picture, and the picture which results from optimal thresholding is a reduced raw data picture.

The Algorithm For Locating Register Mark Centers

As previously indicated and as shown by the lines which extend to the left and to the right of the optimal thresholding block in FIG. 10, each register point can either be approximately centered on a register mark or it can lie within the halftone dot detail of the halftone separation. If the reduced raw data picture contains a register mark, it is first processed by the connected pixel algorithm described in *Image Analysis in Digital Image Processing Techniques* by Azriel Rosenfeld, published in 1984 (page 275). The connected pixel algorithm provides a group of one tones (black) for the connected pixels of the register mark and zero tones for the background. Working with connected pixels reduces the effect of "noise" (dirt, scratches and other extraneous effects), because the noise appears as separate groups of connected pixels that can be rejected.

In accordance with the present invention, a unique algorithm is used to find the center of a register mark formed by a pair of crossing bars. The algorithm is illustrated diagrammatically in FIGS. 11 and 12. Since the tips of the white background peninsulas coincide with the four exterior points of intersection of the two black crossing bars, location of the peninsula tips also locates the exterior intersections of the bars. By averaging the locations of the exterior points of intersection, the center of the mark is found to a high degree of accuracy. In carrying out the algorithm, the locations of the peninsula tips are found by finding the shortest runs of pixels that begin with black pixels, then comprise white pixels, and terminate in black pixels.

Figure 12:
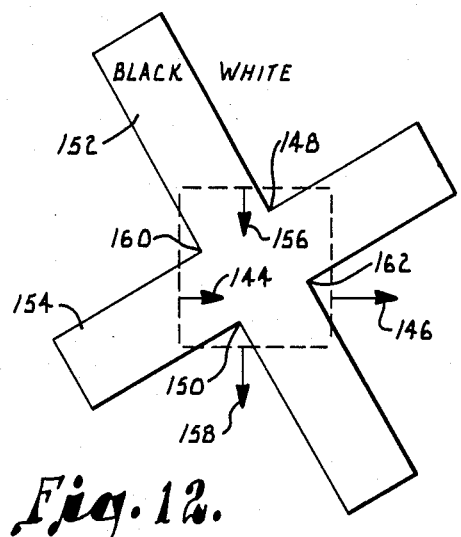
FIG. 12 is a diagrammatic illustration depicting horizontal and vertical scanning used in the algorithmic process for locating the center of a registration mark.

Referring first to FIG. 12, scans are first made in the horizontal direction, as indicated by the directional arrows 144 and 146. The shortest runs of pixels in these directions which satisfy the foregoing qualifications provide the locations of points 148 and 150 which are two of the exterior points of intersection between the crossing black bars 152 and 154. Then, scanning is performed in the vertical direction, as indicated by the directional arrows 156 and 158. These scans locate the points 160 and 162 which are the remaining two exterior points of intersection between the bars 152 and 154. The average of the locations of points 148, 150, 160 and 162 can then be calculated in order to provide a highly accurate result as to the center of the register mark.

In the event that the crossing bars of the mark are parallel to the directions of the scans, four shortest runs of pixels will not be found. In order to avoid this problem relating to orientation of the reference mark, the scanning is repeated in directions oblique to the horizontal and vertical run scans if the horizontal and vertical run scans do not locate the four shortest runs of pixels.

Figure 11:
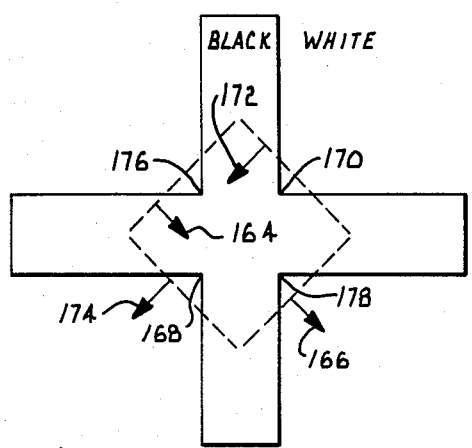
FIG. 11 is a diagrammatic illustration depicting the oblique scanning used in the algorithmic process for locating the center of a cross shaped register mark.

Thus, as shown in FIG. 11, scans are made in the direction indicated by the directional arrows 164 and 166 which are oriented at 45° to the horizontal scans depicted by arrows 144 and 146 in FIG. 12. The scans (164 and 166) locate the points 168 and 170 which cannot be located by horizontal or vertical scanning. Finally, scanning is carried out in a direction perpendicular to arrows 164 and 166, as indicated by directional arrows 172 and 174. These scans locate the points 176 and 178, and the average of the four points of intersection can be computed to locate the center of the mark.

By scanning horizontally and vertically and also obliquely, the four shortest pixel runs can be found in all cases from one type of scanning or the other. Thus, any problems relating to orientation of the reference mark are avoided. This algorithm has the further advantage that the shortest pixel runs can only appear at the tips of the white or background peninsulas, and they cannot appear at other picture boundaries. Thus, if the register mark cross intersection lies within the outer boundaries of the picture, the algorithm will provide an accurate location as to the center of the mark.

In the case of register marks, the movement necessary to align each register mark with the reference register mark can be calculated in terms of a movement in the X direction and a movement in the Y direction. If both of the register points are accurate register marks, then registration can be achieved by aligning the two register marks of each of the second, third and fourth films with the register marks of the reference film.

The Algorithms For Halftone Dot Detail

If the register point contains halftone dot detail of the picture, the algorithmic process involves construction of registration pictures from data which are extracted from the reduced raw data pictures. The extracted data are used to compute the halftone screen angle, the average interdot spacing, and the fractional area with respect to a filled, square halftone dot cell occupied by each black halftone dot centered on the natural halftone grid of centers. The average interdot spacing can lie in the range from 1/100 to 1/200 inch, and the spacing can be different on the films which are to be registered. However, the registration pictures that are constructed must have the same spacing between tone centers so that registration distances have a consistent meaning for the pictures that are to be registered by purely translational computations. By definition, the tone center spacing is selected to lie between the extremes of the minimum and maximum screen rulings that are allowed (100 per inch and 200 per inch). Therefore, a registration picture by definition is a digital picture that is square with the raw data picture and comprises a grid of continuous tones ranging from one (white) to zero (black), with the tones located on centers that are separated by 1/150 inch (150 line screen reference pictures). Such pictures emulate the human eye response to halftone viewing, but they must be further processed before actual registration can be attempted (enhancement and tone modification). The registration picture cell centers do not lie on halftone dot centers due to the screen angle and the possibility that the raw data is not 150 line screen. Therefore, interpolation is required to produce a 150 line picture from a data pattern that is cocked at an angle and does not have 150 line screen spacing. As will subsequently be described, the algorithmic process basically involves constructing a tone grid on the natural cocked grid of each color separation and then interpolating the tone grid to the desired picture.

The Algorithm For Locating Initial Data Dot Centers

The first algorithmic process involves locating the centers of data dots which are defined as halftone dots having accurate centers that serve to predict the halftone pattern screen angle and the average interdot spacing. About 40 data dots are required for acceptable accuracy, and they can be either white dots or black dots, depending upon which dot color is in more abundant supply. Black data dots are located simultaneously with white data dots, and the data dot set (black or white) which is selected is determined by the relative number of data dots found in each set. Later in the algorithmic process, only black dot centers are considered, so if the white dots are data dots, the white dot grid centers are ultimately offset to black dot centers by one half of a halftone cell dimension. This procedure is accurate because each white dot center lies at the center of a square of black dot centers and vice versa.

The algorithmic method which is employed to locate data dot centers involves scanning the reduced raw data picture by rows, outward from the center and alternating up and down. The reason for working outward from the center and alternating up and down is to locate data dots which are substantially centrally situated in the picture in order to improve the accuracy of the entire halftone dot center grid computed from transformation equations that use the screen angle and the average interdot spacing.

Figure 13:
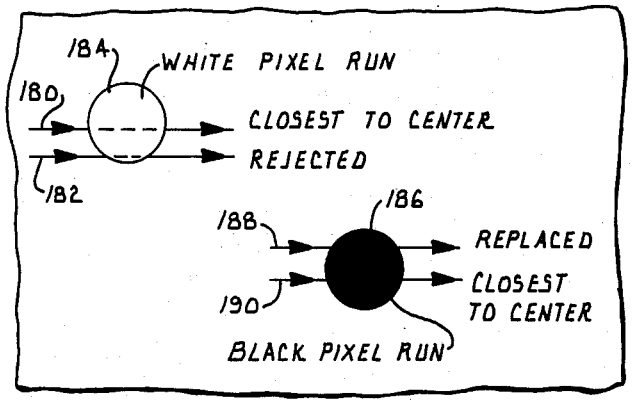
FIG. 13 is a diagrammatic illustration depicting scanning used in the algorithmic process for locating initial data dot centers.

FIG. 13 illustrates diagrammatically the data dot scanning. Along each row, dot centers are located which are the centers of runs of pixels that begin with white pixels, then comprise black pixels and eventually terminate in white pixels (black dots) or begin with black pixels, then comprise white pixels and finally terminate in black pixels (white dots). Redundant run centers within a discrimination radius (selected as the halftone cell dimension divided by the square root of two) of a previously established run center are either rejected (if they are on shorter pixel runs and thus farther from the dot center) or used to replace a previously established run center (if they are longer runs and thus closer to the dot center).

In FIG. 13, numerals 180 and 182 identify successive runs of pixels made through a white dot 184. The run 180 is made first and establishes an initial data dot center at the center of the white pixel run. Since the subsequent run 182 is a shorter run, it is rejected because its center is farther from the center of the white dot 184. A black dot 186 is scanned first by the pixel run 188 and then by the run 190. An initial dot center established by the first run 188 is replaced by the subsequent run 190 because run 190 is longer and its center is located closer to the dot center than is the center of the shorter run 188. Thus, the initial dot center established by run 190 replaces the earlier established initial dot center resulting from run 188.

The Chord Bisection Algorithm For Improving Data Dot Centers

Figure 14:
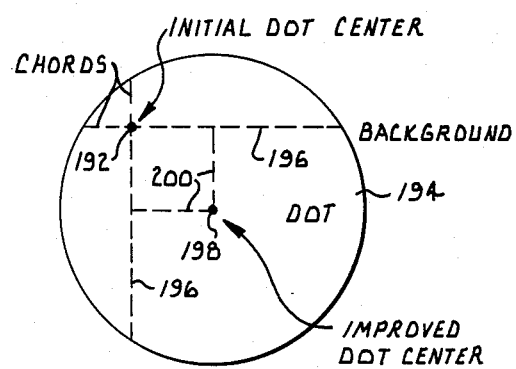
FIG. 14 is a diagrammatic illustration depicting the chord bisection algorithm used to improve the data dot center locations.

When the scanning has been completed, each run center is checked for clear background tone at a discrimination radius from the center, at two points located above and below the run center. Each run center that passes this test is then improved by a chord bisection algorithm. The chord bisection routine is illustrated diagrammatically in FIG. 14. Numeral 192 designates an initial dot center for a dot 194 which may be either black or white. Scans are made both up and down and left and right from the initial dot center 192 until background pixels of the contrasting background color are located. The length of two mutually perpendicular chords 196 are established as the distances between the background pixels along each such scanning run. An improved center 198 for the dot 194 is located at the intersection between perpendicular bisectors 200 of the chords 196. In order to realize accurate results, the improved centers are computed to a fraction of a pixel, and it is noted that improved centers are provided even for dots that are noncircular. A final background suitability test (similar to the test performed on the initial data dot centers but more stringent) is performed on each improved dot center. This more stringent test checks for background tones on a discrimination circle about the improved dot center, at points which are separated by 10°. Each dot that passes all of the tests is an approximately symmetrical dot having an accurate center, and the location of its center is stored in memory.

The Algorithm For Computing The Screen Angle And Average Interdot Spacing

The next algorithmic process involves making use of the data dots to compute the halftone screen angle and the average interdot spacing. First, the data dot located closest to the center of the reduced raw data picture is selected as an origin data dot. Then, an initial screen angle is determined based on the angle of a straight line extending between the two data dots which are closest together. The distance between these two data dots is selected as the initial interdot spacing.

Figure 15:
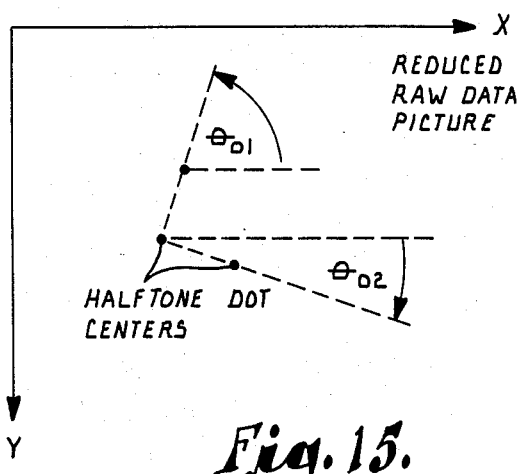
FIG. 15 is a diagrammatic illustration depicting the manner in which the initial screen angle is selected.

As illustrated diagrammatically in FIG. 15, it is desirable for the initial screen angle to be as close as possible to horizontal. Consequently, if the initial screen angle $\theta_0$ is greater in magnitude than 45°, it is replaced by another initial screen angle which is determined by the arrowed substitution $\theta_0 \to \theta_0 - \text{sign}(\theta_0)\pi/2$. The screen angle must only be based on parallel lines of dots, and it is permissible to choose those lines at right angles to the other possible lines in a square grid pattern of dot centers. As illustrated in FIG. 15, if the initial screen angle $\theta_{01}$ were computed from the data, it would be replaced by the angle $\theta_{02}$. Thus, the initial screen angle $\theta_0$ always lies between $-45°$ and $+45°$, and this reduced range of angles assists in obtaining maximum accuracy from the results that are computed.

Figure 16:
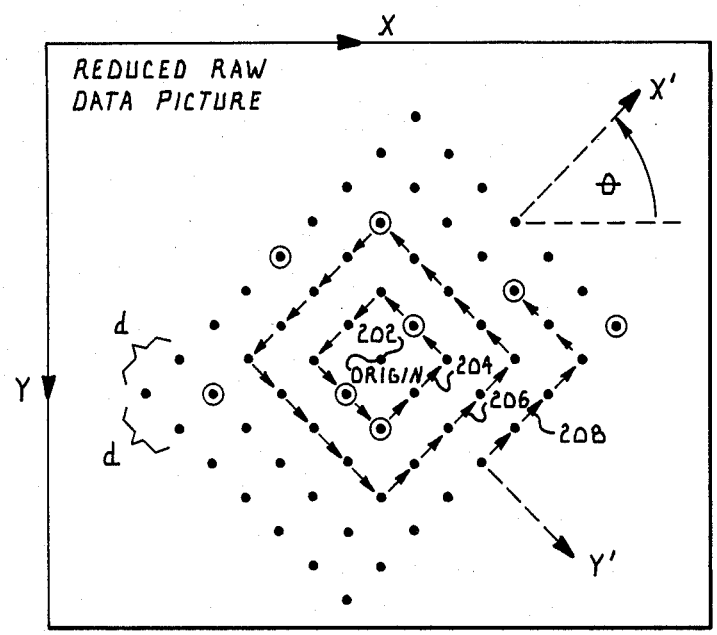
FIG. 16 is a diagrammatic illustration depicting the geometry of the square spiral search used to locate potential data dot centers.

Computation of the final screen angle involves the use of a least squares method and a spiral search which is illustrated diagrammatically in FIG. 16. The prime coordinate system (x', y') is the coordinate frame of the cocked screen grid (i.e. the prime coordinate frame is cocked at the screen angle), and it is centered at the origin data dot indicated at 202 in FIG. 16. The unprime coordinate system is the xy coordinate frame of the raw data picture, where x is positive to the right and y is positive down from the upper left hand corner of the picture. The least squares method of finding the screen angle requires pairs of unprime and prime coordinates for each data dot point. The prime coordinates are found by performing a square spiral search centered at the origin data dot 202 in the prime frame. Each prime coordinate lies on a halftone dot center that may or may not contain a data dot. In order to determine if a data dot lies at each search point prime coordinate, each prime coordinate is transformed to the unprimed frame by using the transformation equations for a combined translation and rotation:

$$x = x' \cos\theta - y' \sin\theta + h \quad (1)$$

$$y = y' \cos\theta + x' \sin\theta + k \quad (2)$$

In these equations, $\theta$ is the screen angle and h, k are the coordinates of the location of the origin data dot 202 in the unprime xy frame.

As shown in FIG. 16, the square spiral search is performed outwardly shell by shell from the origin data dot 202. First, the innermost shell 204 is searched and each potential data dot center located in the prime coordinate frame is checked to determine if its unprimed frame location from equations (1) and (2) is within a discrimination distance from the center of a data dot of known unprime coordinate. Each data dot center which is confirmed to lie within the discrimination distance is a confirmed data dot, and another pair of prime, unprime coordinates is confirmed as a data point. The spiral search is continued outwardly in the next shells 206 and 208 in the same manner, and the searching continues until all potential data dot points in the prime frame have been checked against the known data dot points in the unprimed frame. In FIG. 16, the data dots are circled for illustrative purposes.

Each confirmed data point coordinate pair is added to the store of data. Based on the current number N of confirmed data point coordinates, the least squares solution for the screen angle $\theta$ is computed from the solution to minimizing S in $\theta$ where S is the summed distance between the prime frame coordinate and the same prime frame coordinate expressed by the transformation equations as a function of the screen angle, the coordinates h,k and the data dot unprime coordinate:

$$S = \sum_{i=1}^{N} \{[(x_i - h)\cos\theta + (y_i - k)\sin\theta - x_i']^2 + [(y_i - k)\cos\theta - (x_i - h)\sin\theta - y_i']^2\} \quad (3)$$

By differentiating its expression for S with respect to $\theta$ and equating the result with zero, the solution for $\theta$ becomes:

$$\theta = \tan^{-1}\left\{ \frac{-\sum_{i=1}^{N} y_i'(x_i - h) + \sum_{i=1}^{N} x_i'(y_i - k)}{\sum_{i=1}^{N} x_i'(x_i - h) + \sum_{i=1}^{N} y_i'(y_i - k)} \right\} \quad (4)$$

The average interdot spacing d is computed as follows from the data dot coordinates $x_i$, $y_i$, h,k; and $x_{in'}$, $y_{in'}$:

$$d = N^{-1} \sum_{i=1}^{N} \left[ \frac{(x_i - h)^2 + (y_i - k)^2}{x_{in}'^2 + y_{in}'^2} \right]^{\frac{1}{2}} \quad (5)$$

where $x_{in'}$, $y'_{in'} = 0, +1, +2 \ldots$ are integral prime frame (unit spacing) data point coordinates (i.e. prime frame coordinates with the interdot spacing divided out). The solutions for $\theta$ and $d$ provided by equations (4) and (5) are self improving and finally involve all data dots and yield the best screen angle and average interdot spacing that can be obtained.

Construction Of A Halftone Cell Block Pixel Counting Mask

Figure 17:
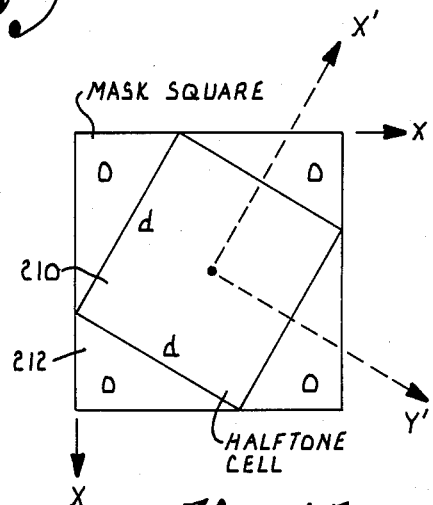
FIG. 17 is a diagrammatic illustration depicting the use of a counting mask to count the number of black pixels contained within a halftone cell.

The next algorithmic process involves counting the number $n_b$ of black pixels that are located inside of a square halftone cell of side $d$, centered on a black halftone dot. The counting operation is accomplished at highest speed by constructing a halftone cell black pixel counting mask and utilizing vector arithmetic which can be optimally performed by the high speed array processor. The counting mask is a square array of numbers equal to one in the region of interest and zero elsewhere. The region of interest is a square halftone cell having sides $d$ and cocked or oriented at the screen angle $\theta$, as indicated at 210 in FIG. 17. This square 210 is contained and centered within a larger square 212 which is the mask array. It is noted that the prime coordinate system is cocked at the screen angle $\theta$ relative to the unprime coordinate system.

The mask 212 is constructed by transforming each mask point in the xy unprime frame of the mask to the prime frame x', y' of the square cell to determine if each pixel in the mask unprime frame should properly be assigned the binary number one or zero, depending upon whether or not the pixel lies within the halftone cell boundaries in the prime frame. If D is a square array of reduced raw data picture tones having the same size as the counting mask Mc and centered over a black halftone dot within a halftone square cell oriented the same as the cell in the counting mask, then the number of black pixels in the halftone dot is given by the product of the mask Mc and the data array D:

$$n_b = \sum_{i=1}^{L_c} \sum_{j=1}^{L_c} D(j,i)M_c(j,i) \quad (6)$$

In this expression, $L_c$ is the square size of the mask (typically, $L_c$ is 25 to accommodate $d$ for screen rulings as low as 100 lines per inch). Only the black pixels of tone one located within the halftone dot contribute to $n_b$, as required.

CONSTRUCTION OF A CONTINUOUS TONE PICTURE

The next algorithm involves construction of a continuous tone picture (a picture in which the tones vary continuously between the darkest tone and the lightest tone) in the prime frame with the tones centered at halftone dot centers. The process involves computing a continuous tone for each black dot center in the prime frame that lies within the raw data picture. First, it is necessary to offset the data dot origin if the data dots are white dots. This is accomplished by offsetting the data dot origin h,k by $h \rightarrow d/2 (\cos \theta - \sin \theta) + h$; $k \rightarrow d/2 (\cos \theta + \sin \theta) + k$. By this process, the location of the center of the origin dot becomes a black dot center (the screen angle stays the same). Each tone is computed by first vector multiplying the counting mask $M_c$ by the data in the reduced raw data picture window D of mask size that is centered at the tone center. This yields from equation (6) the count $n_b$ of black pixels within a halftone cell of square side $d$ centered on the dot center. The light transmission factor through such a cell is:

$$t = 1 - \frac{n_b}{n_f} j 0 \leq n_b \leq n_f \quad (7)$$

where $n_f$ is the total number of pixels in the cell.
The optical density O is:

$$O = -\log_{10}(t) \quad (8)$$

If t is smaller than cutoff 0.05 (corresponding to a 0.95 maximum cutoff dot area), t is assigned the value of 0.05 so that the range of optical density is not infinite. The continuous tone is then given by the expression:

$$\text{tone} = \frac{O_{max} - O}{O_{max}} \quad (9)$$

where $O_{max}$ is $-\log_{10}(t_{min})$ with $t_{min} = 0.05$.

A filled dot (black) transmit no light and has tone 0. An open dot (white) transmits all light and has tone 1. This definition of tone is based on the definition of optical density that is used in densitometers in the printing industry that yield average dot size from optical density readings of halftones. The tones here are more exact because the tone cells are centered on dot centers and are not randomly located over dot cells as is the case in the densitometer.

Interpolation To A 150 Line Screen Picture

The next algorithmic process involves interpolation within the continuous tone prime frame picture to a 150 line screen picture that is square with the raw data picture. The continuous tone picture constructed by the foregoing algorithm is an array of tones cocked at the screen angle $\theta$ and spaced tone to tone by the distance $d$ (illustrated in FIG. 16) with a tone computed for each halftone dot center. The desired registration picture is centered and square with the picture depicted in FIG. 16, but it consists of a square array of tone centers separated center to center by 1/150 inch. As will be described, the data of FIG. 16 are interpolated to obtain the desired registration picture tone centers.

For each tone center in the unprime frame $x_c$, $y_c$, the corresponding location in the prime frame of FIG. 16 is obtained from the coordinate transformation equations:

$$x_{cin'} = [(x_c - h)\cos \theta + (y_c - k)\sin \theta]c l^{-1} \quad (10)$$

$$y_{cin'} = [(y_c - k)\cos \theta - (x_c - h)\sin \theta]c l^{-1} \quad (11)$$

A unit spacing description suitable for the interpolation to be performed is achieved by dividing by $d$. In FIG. 16, the center of a 9×9 interpolation data point grid is:

$$n_{ip} = [x_{cin'}] \quad (12)$$

$$n_{jp} = [y_{cin'}] \quad (13)$$

where [q] denotes rounding the real number q to the nearest integer. The interpolation offset in the prime frame from center in $n_{ip}$ $n_{jp}$ to $x_{cin'}$, $y_{cin'}$ in the prime frame is:

$$d_{hp} = x_{cin'} - n_{ip} \tag{14}$$

$$d_{kp} = y_{cin'} - n_{jp} \tag{15}$$

Figure 18:
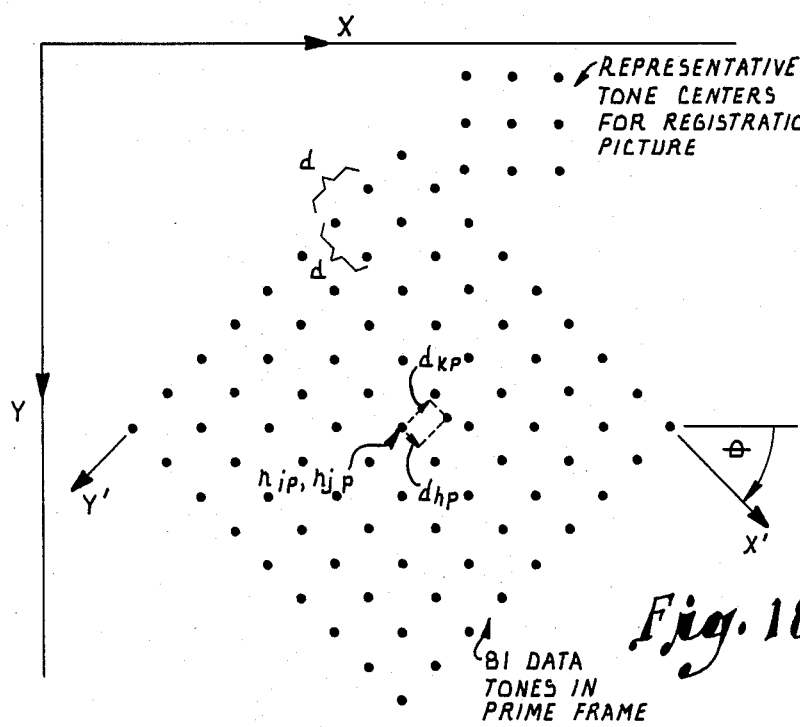
FIG. 18 is a diagrammatic illustration depicting the geometry of the interpolation process used to construct registration pictures.

The interpolation geometry is shown in FIG. 18. The interpolation formula is the well known bicubic spline interpolation described in *Approximation Theory and Methods*, M. J. D. Powell, 1981 (page 226 and Chapter 19). However, a specialization of the general formula given in this reference is used in the present invention. The specialization is to restrict the interpolation offset to be reckoned from the center point of the interpolation data array, thereby insuring maximum surround of data and maximum accuracy from the interpolation formula. The specialized formula is:

$$P(n_j, n_i) = \sum_{m=-4}^{4} \sum_{n=-4}^{4} l_m(d_{hp}) \lambda_n(d_{kp}) p_d(n_{ip}+n, n_{ip}+m) \tag{16}$$

where P is the desired registration picture tone, $P_d$ are data tones, and the cardinal functions $1_m$, $\lambda_n$ of the interpolation are given by linear combinations of the cubic B splines $B_p^3$ (evaluated at the interpolation offsets $d_{hp}$, $d_{kp}$ previously given) weighted by coefficients $C_{pm}$, $C_{pn}$:

$$l_m(d_{hp}) = \sum_{p=-\infty}^{\infty} C_{pm} B_p^3(d_{hp}) \tag{17}$$

$$\lambda_n(d_{kp}) = \sum_{p=-\infty}^{\infty} C_{pn} B_p^3(d_{kp}). \tag{18}$$

The $C_{pm}$, $C_{pn}$ weighting coefficients in the cardinal functions $1_m$, $\lambda_n$ are (11 denotes absolute value):

$$C_{pm} = 4\sqrt{3} \; (\sqrt{3} - 2)^{|m-2-p|} \tag{19}$$

$$C_{pn} = 4\sqrt{3} \; (\sqrt{3} - 2)^{|n-2-p|}. \tag{20}$$

The infinite sums in the cardinal functions $1_m$, $\lambda_n$ have only a finite number of nonzero terms, and these are easily determined in making use of the fact that the B spline is zero outside of the end points between which it is defined. The cubic B splines are computed directly from the definition:

$$B_p^3(\epsilon) = 24^{-1}[(\epsilon-\xi_p)_+^3 - 4(\epsilon-\xi_{p+1})_+^3 + 6(\epsilon-\xi_{p+2})_+^3 - 4(\epsilon-\xi_{p+3})_+^3 + (\epsilon-\xi_{p+4})_+^3] \tag{21}$$

where $\xi_p = p = 0, \pm 1, \pm 2 \ldots$ are the knots or join points of the piecewise polynomial spline, q is an illustrative argument, and the truncated cubed differences in the spline formula are defined as:

$$(\epsilon-\xi)_+^3 = (\epsilon-\xi)^3 \text{ for } \epsilon-\xi > 0 \tag{22}$$

$$(\epsilon-\xi)_+^3 = 0 \text{ for } \epsilon-\xi \leq 0. \tag{23}$$

Digital Picture Registration

This completes the description of the registration picture building algorithm. However, both of the registration pictures must be enhanced and the tone must be modified on one of them (the picture other than the reference picture), so that the registration process is made more sensitive and accurate. In the registration process, the registration is first found to within the nearest integer row of dots. The registration is then refined systematically, by using a hierarchical interpolated registration that finds the register to one half row of dots, then to one fourth row of dots and finally to one eighth row of dots (or still more finely if warranted by the accuracy of the computations).

The Edge Enhancement Algorithm

The reference registration picture $P_{ref}$ and the other picture $P_{mov}$ which is to be registered with the reference picture are subjected to preregistration edge enhancement. A standard technique to improve registration is to register images that have been convolved with some edge enhancement mask or array of numbers (a digital filter mask). In accordance with the present invention, this standard technique is modified by adding an enhancement to the original picture, thereby retaining the structure of the original picture but highlighting (i.e. giving special treatment to) edge detail, rather than replacing picture detail with edge detail. Edge detail alone can yield unreliable results in classical correlation registration methods. It must be kept in mind that half-tone detail registration has accuracy requirements much higher than other registration applications. For this reason, standard techniques are not always suitable for treating halftone detail.

A known technique for constructing an edge mask is to apply some operator (usually a differential operator) to an analytical representation of the image. In accordance with the present invention, this is done by choosing a novel operator, choosing a novel analytical representation, and calculating the additive enhancement in a novel manner. On a physical basis, a larger response should be obtained near edges that are skewed from horizontal and vertical as compared to edges that are substantially horizontal or vertical. The skewed edges are the critical edges because purely horizontal or purely vertical edges lead to ambiguity in the registration in the dimension other than that of the horizontal or vertical edge. Consequently, enhancement is intentionally chosen in a manner to brighten picture regions without skewed edges and darken (relatively) skewed edge regions. The registration error penalty for incorrectly differencing a bright with a dark picture region is thus increased, and the sensitivity of the minimum error registration procedure is enhanced.

The choice of analytical representation is again bicubic spline interpolation, because it performs well with limited data and yields a twice continuously differentiable analytical representation of picture tones. The operator is constructed from second derivatives because gradient operators tend to have broad peaks near edges. An edge is essentially a region where a first derivative is tending to peak and a second derivative is tending to vanish. Thus, near an edge, the second derivative operator tends to be small and the enhancement procedure brightens edge regions relative to nonedge regions. Nevertheless, by properly choosing the operator, the important skewed edge regions can be brightened less than other edge regions or, equivalently, relatively darkened, thereby increasing the sensitivity of the registration.

The additive enhancement at the j,ith picture location is $1 - P_2(j,i)/m$, where m is the maximum tone of array $P_2$. If M denotes the edge mask, M is two dimensionally, discretely convolved with the registration picture P. The two dimensional discrete convolution equation is:

$$P_2(j,i) = \sum_{m=i-L+1}^{i} \sum_{n=j-L+1}^{j} P(n,m)M(j-n+1, i-m+1) \quad (24)$$

where L=5 is the size of the square mask M.

The convolution geometry is shown in FIG. 19. The dashed lines 214 and 216 enclose the resulting picture area that is usable following convolution. The square mask M is symmetric and is invariant to rotation by 180°. Before using $P_2$, $P_2$ is modified to $P_2 - P_{2min}$ if $P_{2min}$ is a negative minimum of $P_2$ in order to rescale $P_{2/m}$ to a picture having a range of zero to one consistent with $P_2$. In the total picture $P(j,i) + [1 - P_2(j,i)/m]$, the j,ith location in P is the lower right-hand corner point of evaluation of the two dimensional convolution. The final picture is smaller than P because room is allowed to form exact convolutions everywhere within P. The mask M is constructed from a splined representation of P similar to equation (16). The mask M is 5×5 and consists of the coefficient factor (multiplying $P_d$ in the similar version of equation 16) differentiated by a product operator that gives smaller response near horizontal or vertical edges and larger response near edges that are skewed from the vertical or horizontal. The operator is:

$$\frac{\partial^4}{\partial x^2 \partial y^2} \quad (25)$$

The operator acts on the B spline interpolation offset arguments x and y in the interpolation expression similar to equation (16) and evaluated at 0, 0 interpolation offset. The mask M is then normalized to unit center value by dividing each element of original M by the original M center value. Utilizing the data smoothing concept from the Laplacian-Gaussian edge mask, multiplicatively normalized M is multiplied for each j,ith element by corresponding j,ith elements in a product data smoothing mask, the j, ith elements of which are given by products of Hamming window functions, namely:

$$\left\{ .54 - .46\cos\left[\frac{\pi}{2}(i+2)\right] \right\} \left\{ .54 - .46\cos\left[\frac{\pi}{2}(j+2)\right] \right\} ; i,j = 0, \pm 1, \pm 2 \quad (26)$$

The final M that results is used in the enhancement convolutions. The Hamming smoothing shape is preferred because it does not fall as rapidly as the Gaussian smoothing shape and, consequently, greater emphasis is placed on data at the mask extremities (allowing more of the data to significantly influence the final results). It appears that the improved results that are obtained from using the operator of expression (25) are attributable to the relative darkening of skewed edge regions, resulting in increased registration accuracy, as previously suggested. However, it should be understood that acceptable results may be obtained by using another mask (such as a Laplacian-Gaussian edge mask) or another operator (such as the Laplacian operator $\partial^2/\partial x^2 + \partial^2/\partial y^2$).

The Tone Normalization Algorithm

Tone normalization of the $P_{mov}$ and $P_{ref}$ pictures is effected by subjecting the tones to a linear transformation. Because the average tone can vary widely between separation colors, registration is adversely affected. Registration is improved by making the tones of $P_{mov}$ more similar to the tones of $P_{ref}$ by a linear tone mapping operation in which the maximum, average and minimum tones of $P_{mov}$ are mapped into the respective maximum, average and minimum tones of $P_{ref}$. This tone mapping preserves the gray scale ordering of the images.

Figure 20:
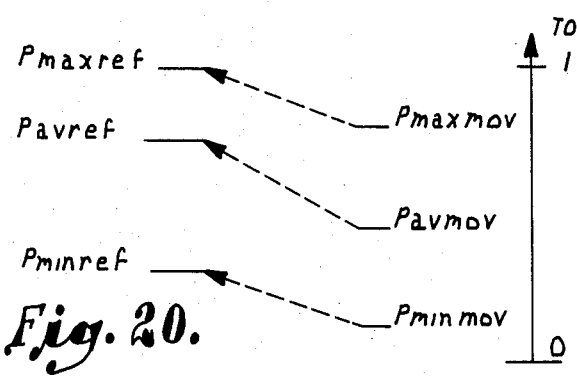
FIG. 20 is a diagrammatic illustration depicting linear tone mapping used in preregistration tone normalization.

As illustrated in FIG. 20, the tone mapping involves modification of only $P_{mov}$; the reference picture $P_{ref}$ is not modified. The tone mapping is applied after edge enhancement in order to avoid weakening edge enhancement by tending to make all edges similar. It is desirable for strong edges to be strong and weak edges to be weak rather than for all edges to be of similar strength. The tone transformation and coefficients are the following:

$$P_{movnew}(j,i) = \alpha P_{movold}(j,i) + \beta \quad (27)$$

$$\alpha = \frac{P_{maxref} - P_{avref}}{P_{maxmov} - P_{avmov}} \text{ for } P_{movold}(j,i) \geq P_{avmov} \quad (28)$$

$$\beta = P_{maxref} - \alpha P_{maxmov} \text{ for } P_{movold}(j,i) \geq P_{avmov} \quad (29)$$

$$\alpha = \frac{P_{avref} - P_{minref}}{P_{avmov} - P_{minmov}} \text{ for } P_{movold}(j,i) \leq P_{avmov} \quad (30)$$

$$\beta = P_{avref} - \alpha P_{avmov} \text{ for } P_{movold}(j,i) \leq P_{avmov} \quad (31)$$

where av, max and min signify average, maximum and minimum tones, and mov and ref signify moved and reference pictures.

Digital Registration To Nearest Row Of Dots

In digitally registering the pictures to the nearest row of dots, $P_{mov}$ is moved (translated) with respect to $P_{ref}$ (in computer simulation of actual motion) by signed integer offsets $n_x$ and $n_y$ that range from $-8$ to 8 pixels (allowing for rough register). The offsets represent the moves of $P_{mov}$ that are necessary to bring it into register with $P_{ref}$. At best registration to the nearest row of dots, the error is smallest from the following sum over absolute picture differences:

$$\text{error} = \sum_{i=i_s}^{i_e} \sum_{j=j_s}^{j_e} |P_{ref}(j,i) - P_{mov}(j - n_y, i - n_x)| \quad (32)$$

where i is positive right and j is positive down from the upper left-hand corner of $P_{ref}$.

The starting (s) and ending (e) pixels that define the overlap region between $P_{ref}$ and $P_{mov}$ are given in the following Table 1:

TABLE 1

| Quadrant | $n_x$ | $n_y$ | $i_s$ | $i_e$ | $j_s$ | $j_e$ |
|---|---|---|---|---|---|---|
| 1 | $\geq 0$ | $\geq 0$ | $1 + n_x$ | $d_p$ | $1 + n_y$ | $d_p$ |
| 2 | $\leq 0$ | $\geq 0$ | 1 | $d_p + n_x$ | $1 + n_y$ | $d_p$ |
| 3 | $\leq 0$ | $\leq 0$ | 1 | $d_p + n_x$ | 1 | $d_p + n_y$ |
| 4 | $\geq 0$ | $\leq 0$ | $1 + n_x$ | $d_p$ | 1 | $d_p + n_y$ |

In table 1, $d_p$ is the size of the square pictures expressed in pixels.

Figure 21:
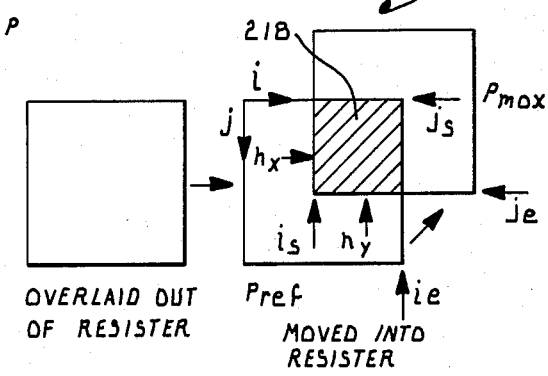
FIG. 21 is a diagrammatic illustration depicting a typical nearest integer registration offset move and picture overlap region.

FIG. 21 diagrammatically illustrates a typical movement of $P_{mov}$ into register with $P_{ref}$ and the resulting overlap region 218 between the two pictures. The error criterion (equation 32) is similar to the SSDA criterion of Barnea and Silverman (IEEE *Trans. on Computers*, Vol. C-21, No. 2, February, 1972), although equation (32) is evaluated directly by fast vector arithmetic (which is faster than a scheme that stops the sums if an attempted registration is failing).

The error actually used in the minimum error registration procedure is the error given by equation (32) multiplied by a product normalization factor $n_1 n_2$ where $n_1$ is:

$$n_1 = \frac{d_p^2}{(j_e - j_s + 1)(i_e - i_s + 1)} \tag{32a}$$

where $d_p$ is the reference size of the pictures (length of a side). This normalization factor (32a) discriminates against false minimum registration errors arising solely because of a small overlap region. A small overlap region contains less data and yields a smaller error from equation (32) that can appear to be the minimum error. As the overlap region shrinks, the denominator of the normalization factor (32a) decreases to thereby compensate for the false minimum error trend. On the other hand, when the correct minimum error does occur within a small window, the true error reduction dominates and the normalization factor (32a) does not result in a false minimum elsewhere for larger overlap regions. The efficacy of the normalization factor $n_1$ has been verified in registration tests with analytical digital pictures constructed to have a precisely known misregister between them. The other normalization factor $n_2$ is one suggested by Barnea and Silverman (IEEE *Trans. on Computers*, Vol. C-21, No. 2, February, 1972), namely:

$$n_2 = \left[ \left| \sum_{i=i_s}^{i_e} \sum_{j=j_s}^{j_e} P_{ref}(j,i) \right| \left| \sum_{i=i_s}^{i_e} \sum_{j=j_s}^{j_e} P_{mov}(j - n_y, i - n_x) \right| \right]^{-\frac{1}{2}} \tag{32b}$$

The factor $n_2$ tends to sharpen registration minima.

Interpolative Registration To Within A Fraction Of A Row Of Dots

In the interpolative refinement of the registration to within a fraction of a row of dots, the nearest integer answer from the nearest row of dots solution gets a fractional part added to it which is an interpolation offset. A trial and error search for the minimum interpolated registration error is used, and it proceeds by first finding the best answer within one half row of dots from $n_x$ and $n_y$. Then, the best answer within one fourth row of dots is determined, and the process is repeated to the one eighth row level. At each stage of the registration, the total registration move to a fraction of a row of dots is:

$$x_{move} = n_x + d_x$$
$$y_{move} = n_y + s_y \tag{33}$$

where $d_x$, $d_y$ is the fractional interpolation offset that is changing as the registration move is successively refined. The latter move is multiplied by 1/150 inch expressed in mils (about 6.67 mils) to provide a total registration move in mils. The interpolated registration error is a modification of equation (32):

$$\text{error} = \sum_{j=j_s+4}^{j_e-4} \sum_{i=i_s+4}^{i_e-4} \left[ \left| \sum_{m=-4}^{4} \sum_{n=-4}^{4} l_m(d_x)\lambda_n(d_y) P_{ref}(j + n, i + m) - P_{mov}(j - n_y, i - n_x) \right| \right] \tag{34}$$

where $n_x$, $n_y$ are here the nearest integer translation from the nearest row of dots solution. The interpolation in equation (34) is 81 point bicubic spline interpolation similar to equation (16), with $d_x$ and $d_y$ the input interpolation offsets expressed as a fraction of a row of dots. The limits $i_s$, $i_e$, $j_s$ and $j_e$ are modified to make room for the interpolation. The error equation (34) is multiplied by the normalization factor:

$$\left\{ \left| \sum_{i=i_s+4}^{i_e-4} \sum_{j=j_s+4}^{j_e-4} \sum_{m=-4}^{4} \sum_{n=-4}^{4} l_m(d_x)\lambda_n(d_y) P_{ref}(j + n, i + m) \right| \cdot \left| \sum_{i=i_s+4}^{i_e-4} \sum_{j=j_s+4}^{j_e-4} P_{mov}(j - n_y, i - n_x) \right| \right\}^{-\frac{1}{2}} \tag{34a}$$

This normalization factor (34a) is the same type of factor as (32b) used on the error in the nearest row of dots registration. This normalization factor is also dependent upon the overlap region and tends to sharpen minima in the registration, because once close to the correct solution, sharper minima are desirable. The factor $n_1$ of (32a) is not needed in the interpolated registration.

Equation (34) is exact, subject only to the error in the interpolation. The derivation of equation (34) proceeds by first noting that $P_{mov}$ has fractional misregistration residual in it when the best nearest integer register is achieved. Thus, it is only necessary to build in a corresponding fractional misregister with respect to current location of j,i of $P_{ref}$ and the summed differences of equation (34) will be zero for perfect register. In order to modify equation (32), it is necessary to replace $P_{ref}$ with $P_{ref}(y',x')$ where the translation transformation that translates integer register frame x, y into Pref final position frame x', y' is (rotational misregister via angle $\theta_r$ is carried along for generality):

$$x' = (x - \bar{h})\cos \theta_r + (y - \bar{k})\sin \theta_r \tag{35}$$

$$y' = (y - \bar{k})\cos \theta_r - (x - \bar{h})\sin \theta_r \tag{36}$$

The symbols x, y and x', y' are used in different contexts here than previously. Here, the unprime frame x, y overlays (same origin) the i,j frame of $P_{ref}$ indicated in FIG. 21.

Building in misregister involves the step of performing a translation of $P_{ref}$ opposite to the move desired to move $P_{mov}$ into register with $P_{ref}$. In other words, the picture $P_{ref}$ is moved by a fractional translation offset $\bar{h}$, $\bar{k}$ into register with $P_{mov}$. However, viewed as a move of $P_{mov}$ into $P_{ref}$, the required translation is the opposite move $-\bar{h}, -\bar{k}$. Consequently, the translation of $P_{ref}$ is:

$$\bar{h} = -d_x \tag{37}$$

$$\bar{k} = -d_y \tag{38}$$

with $x = i\Delta x$ and $y = j\Delta y$ ($\Delta x = \Delta y$ is the grid spacing), equations (35) and (36) can be written in the form:

$$x' = i\Delta x + \alpha \Delta x \tag{39}$$

$$y' = j\Delta y + \beta \Delta y \tag{40}$$

where the resulting fractional offsets (fractions of spacings $\Delta_x$ and $\Delta_y$) $\alpha$ and $\beta$ are:

$$\alpha = i(\cos \theta_r - 1) + cl_x \cos \theta_r + (j + cl_y)\sin \theta_r \tag{41}$$

$$\beta = j(\cos \theta_r - 1) + cl_y \cos \theta_r - (i + cl_x)\sin \theta_r \tag{42}$$

Evaluating the latter equations at $\theta_r = 0$, it is found that $\alpha = d_x$ and $\beta = d_y$.

This proves that the correct interpolation offsets arise from the process of exactly building into $P_{ref}$ misregister with respect to the starting position of $P_{ref}$. Equation (34) has also been numerically verified to high accuracy by performing interpolative registration on analytic function digital pictures constructed out of register by a precisely known amount, by using the same transformation equation technique described for building in misregister opposite to the desired registration move.

THE FINAL CHASE MOVEMENT ALGORITHM FOR REGISTRATION AND PUNCHING

Figure 22:
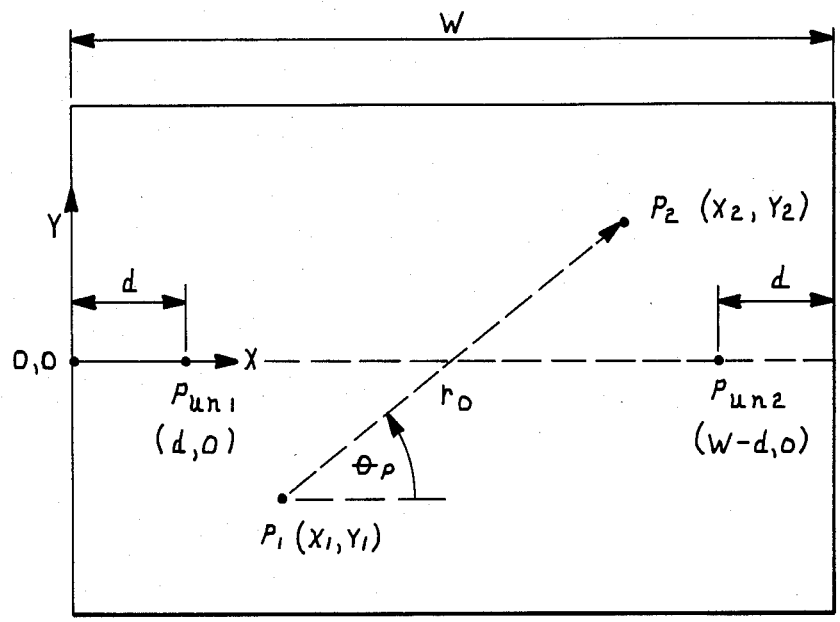
FIG. 22 is a diagrammatic illustration depicting the geometry of the movable chase and selected registration points.

In order to punch each film at the proper locations, it is necessary to calculate the chase movement that is necessary for each film to achieve registration. FIG. 22 shows the geometry of the chase with the two picture points $P_1$ and $P_2$ selected. The points are spaced apart by the distance $r_0$, and the angle of the line between the points $P_1$ and $P_2$ relative to the x axis is $\theta_p$. The points designated $P_{un1}$ and $P_{un2}$ are two punch stations which are always fixed in space at the indicated locations relative to the space fixed xy frame. In FIG. 22, the chase is in its reference or home position prior to movement.

It has been found to be more economical and efficient to utilize a single punch at the station $P_{un1}$ rather than two spaced apart punches, although the latter arrangement is possible. In order to locate the proper punch points in alignment with the single punch at the punch station $P_{un1}$, it is necessary to first obtain the final registration solution and then use the solution to compute the necessary chase movements relative to the punch.

The Final Registration Solution

The algorithmic computations yield the required translational moves, whether based on register marks or registration pictures. The required moves at $P_1$, $P_2$ are $$P_1: D_{x1}, D_{y1} \tag{43}$$

$$P_2: D_{x2}, D_{y2} \tag{44}$$

Relative to the first point, these moves are the same as a uniform chase move of $D_{ux} = D_{x1}$ and $D_{uy} = D_{y1}$ accompanied by a y rotation move at $P_2$, $\Delta y = D_{y2} - D_{y1}$. The $\Delta x$ that accompanies $\Delta y$ cannot be reliably taken as $D_{x2} - D_{x1}$ due to possible input error. Rather, $\Delta x$ can be calculated exactly in order to preserve the separation $r_0$ after the move. The $r_0$ distance preservation equation that must be solved for $\Delta x$ is:

$$(x_2 + \Delta x - x_1)^2 + (y_2 + \Delta y - y_1)^2 = (x_2 - x_1)^2 + (y_2 - y_1)^2 \tag{45}$$

This quadratic equation in $\Delta x$ can be solved and the solution can be manipulated into the following computationally suitable form:

$$\Delta x = \frac{-(x_2 - x_1)\left[\dfrac{2(y_2 - y_1)\Delta y + \Delta y^2}{(x_2 - x_1)^2}\right]}{1 + \sqrt{\dfrac{2(y_2 - y_1)\Delta y + \Delta y^2}{(x_2 - x_1)^2}}} \tag{46}$$

Figure 23:
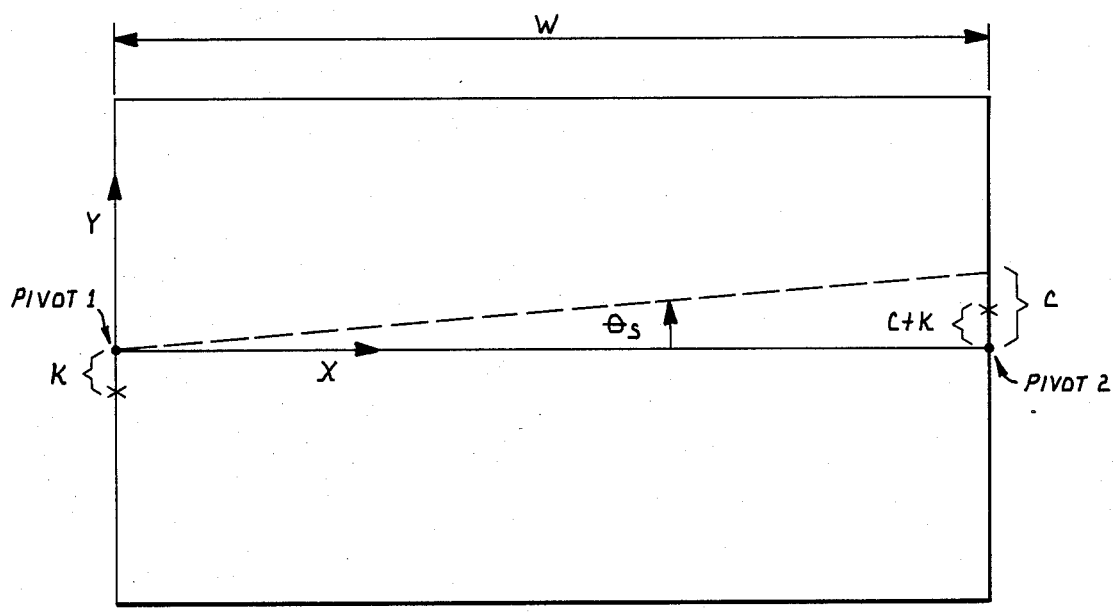
FIG. 23 is a diagrammatic illustration of the pivot move and translation required for final registration.

FIG. 23 illustrates the geometry and moves required at the pivot points 1 and 2 to leave $y_1$ as it is and move $y_2$ to $y_2 + \Delta y$. These moves (illustrated for a positive $\Delta y$) constitute a rotation about pivot point 1 (exaggerated in the drawing) followed by a uniform chase translation of k in the y direction. As shown in FIG. 23, the net moves result in pivot point 1 moving down by the distance k while pivot point 2 moves up by the distance c+k (from the reference starting position). The uniform x, y chase moves are effected later to obtain final left and right pivot moves. Note then that $y_1$ will properly go to $y_1 + D_{y1}$ and $y_2$ will go to $y_2 + \Delta y + D_{y1} = y_2 + D_{y2}$. This incidentally proves that the correct $\Delta y = D_{y2} - D_{y1}$.

The move equations that must be solved for $\sin \theta_s$ and k are obtained from the y coordinate transformation equations that describe the effect on the y positions of the k translation and the rotation about the pivot point:

$$y_2 + \Delta y = y_2 \cos \theta_s + x_2 \sin \theta_s + k \tag{47}$$

$$y_1 = y_1 \cos \theta_s + x_1 \sin \theta_s + k \tag{48}$$

The transformation involves LHS coordinates measured in the space fixed xy frame of FIG. 22. The RHS coordinates are actually prime frame coordinates in the moving chase fixed frame which is rotated and translated with respect to the xy frame. For purposes of convenience, the primes on the coordinates can be eliminated so that the points of interest can be read directly from FIG. 22 in the xy frame, when the two frames coincide before there has been any translation or rotation. When viewed in this way, the transformation equations equivalently describe how points with RHS coordinates in the initial positions of FIG. 22 are moved to new LHS coordinate positions in the space fixed frame of FIG. 22. This is the most natural or convenient point of view for describing the method.

Elimination of k in equations (47) and (48) provides a quadratic equation in $\sin \theta_s$:

$$[(y_2 - y_1)^2 + (x_2 - x_1)^2]\sin^2 \theta_s - 2(y_2 + \Delta y - y_1) \cdot (x_2 - x_1)\sin \theta_s + (y_2 + \Delta y - y_1)^2 - (y_2 - y_1)^2 = 0. \tag{49}$$

Solving for $\sin \theta_s$ and simplifying to a computationally conditioned solution provides:

$$\sin\theta_s = \frac{2(y_2 - y_1)\Delta y + \Delta y^2}{(y_2 + \Delta y - y_1)(x_2 - x_1) + (x_2 - x_1)(y_2 - y_1)\sqrt{1 - \frac{2(y_2 - y_1)\Delta y + \Delta y^2}{(x_2 - x_1)^2}}} \quad (50)$$

$\theta_s$ is small, so $\cos\theta_s$ can be evaluated directly:

$$\cos\theta_s = \sqrt{1 - \sin^2\theta_s} \quad (51)$$

$\sin\theta_s$ and $\cos\theta_s$ are thus known, so the second move equation can be solved for k:

$$k = y_1(1 - \cos\theta_s) - x_1\sin\theta_s \quad (52)$$

$$1 - \cos\theta_s = \frac{\sin\theta_s \sin\theta_{s\frac{1}{2}}}{\cos\theta_{s\frac{1}{2}}} \quad (53)$$

$$\theta_s = \tfrac{1}{2}\tan^{-1}\left(\frac{\sin\theta_s}{\cos\theta_s}\right) \quad (54)$$

The reason for evaluating $1 - \cos\theta_s$ in this manner is to avoid severe loss of precision due to the fact that $\theta_s$ is aooroximately equal to zero.

The distance c in FIG. 23 is:

$$c = w\tan\theta_s = \frac{w\sin\theta_s}{\cos\theta_s}. \quad (55)$$

Including the uniform chase y move, the right final pivot move is $c+k+D_{y1}$, and the left final pivot move is $k+D_{y1}$. The errors in the x position at points 1 and 2 are the same because the chase is a rigid body, and compensation can be made for the errors by a final chase uniform x move. The error in $P_1$ (where the point should be located, minus where it actually is $e_{1x}$:

$$e_{1x}=(x_1\cos\theta_s-y_1\sin\theta_s)-x_1=-x_1(1-\cos\theta_s)-y_1\sin\theta_s \quad (56)$$

The evaluation of $1-\cos\theta_s$ is previously indicated. The $P_2$ error is $e_{2x}$:

$$e_{2x}=(x_2\cos\theta_s-y_2\sin\theta_s)-(x_2+\Delta x)=-x_2(1-\cos\theta_s)-y_2\sin\theta_s-\Delta x \quad (57)$$

where the evaluation of $1-\cos\theta_s$ and $\Delta x$ are indicated previously. Finally, the total uniform chase move in the x direction, including the original move $D_{ux}$ is:

$$x_{mov}=-\tfrac{1}{2}(e_{1x}+e_{2x})+D_{x1} \quad (58)$$

where $e_{1x}$ and $e_{2x}$ can readily be shown to be numerically equal and analytically exactly equal (a check on the validity of the results). However, these quantities are averaged in the equation to serve as a reminder that the computation involves two equal moves.

An alternative embodiment of the machine was constructed with a movable chase able to actually carry out the required left and right pivot moves and the final uniform x move (the pivot moves were done in two steps, first the right pivot moves by c with the left pivot fixed, then both pivots move together by k and $D_{y1}$ to achieve final pivot moves of (left, right) $=(k+D_{y1},c+k+D_{y1})$. Two films with register marks at $P_1,P_2$ were specially prepared so that the marks of the second film were out of register by a precisely known amount with respect to the first on reference film. This input data was used to calculate the left and right pivot moves and the uniform x move according to the equations given previously. The machine carried out the motions on the second films and it was observed that the resulting registration of film 2 to the reference film was indeed highly accurate. Thus, the final registration solution has been experimentally verified in a controlled situation.

The Chase Movements For Punching Film

In order to properly align the films with the single punch station at $P_{un1}$ in FIG. 22, it is necessary to compute from the final registration solution the translation of the initial film point $P_{un1}$ to its final position in the space fixed frame xy as a result of the full chase movements previously described. This translation is performed by moving the chase and then punching the film. The analogous translation of initial film point $P_{un2}$ in FIG. 22 is computed, and a combined chase translation consisting of the desired $P_{un2}$ translation plus the translation to carry $P_{un2}$ over to $P_{un1}$ plus the compensation for the first ($P_{un1}$) translation is carried out, followed by the final punch and removal or ejection of the film. This provides the same results as if the translation and rotation described by the final registration solution are actually carried out. In that solution, each point has a different translation to its final position due to the rotation. In the one punch technique which is preferably employed in the present invention, the one point of interest (the punch point) is singled out and translated in the manner indicated by the movements that result from the final registration solution.

The translations which are computed for the film ppoints $P_{un1}$ and $P_{un2}$ of FIG. 22 are obtained from the transformation equations and the uniform chase movement equations described previously. The translations are final position minus initial position in the space fixed xy frame of FIG. 22, and they are given by:

$$x_{un1}-d=-d(1-\cos\theta_s)+D_{x1}-\tfrac{1}{2}(e_{1x}+e_{2x}) \quad (59)$$

$$y_{un1}-0=d\sin\theta_s+k+D_{y1} \quad (60)$$

$$x_{un2}-(w-d)=-(w-d)(1-\cos\theta_s)+D_{x1}-\tfrac{1}{2}(e_{1x}+e_{2x}) \quad (61)$$

$$y_{un2}-0=(w-d)\sin\theta_s+k+D_{y1}. \quad (62)$$

The results for the variables in the translation expressions are previously indicated. The distance between the final position points is:

$$\sqrt{(x_{un2} - x_{un1})^2 + (y_{un2} - y_{un1})^2} = \sqrt{(w - 2d)^2\cos^2\theta_s + (w - 2d)^2\sin^2\theta_s} = w - 2d \quad (63)$$

As indicated since $\sin^2\theta_s+\cos^2\theta_2=1$, the distance is exactly equal to $w-2d$ which is the distance between the punch stations before the move.

AVOIDING EXCESSIVE ERROR DUE TO INPUT DATA ERROR

As a final matter, it is possible for the angle $\theta_p$ in FIG. 22 to be so large that $\Delta_y$ from the data is large (due to unavoidable registration error) when it should be quite small. This can result in an unexpectably large error in the pivot moves.

Although it has been found most economical to provide a fixed digital camera 32 and a fixed punch 108, and to mount the films which are to be registered on the movable chase 52, it should be apparent that the camera and/or the punch can be made movable. It should also be apparent that both the film and the camera and punch can be movable. In some instances, it is desirable to punch one of the register holes with a round punch and the other registration hole with a slot punch or a punch having a different shape. Thus, two spaced apart punches can be provided, and the two punches can be activated when each film is properly located for punching of the register holes.

From the foregoing, it will be seen that this invention is one well adapted to attain all the ends and objects hereinabove set forth together with other advantages which are obvious and which are inherent to the structure.

It will be understood that certain features and subcombinations are of utility and may be employed without reference to other features and subcombinations. This is contemplated by and is within the scope of the claims.

Since many possible embodiments may be made of the invention without departing from the scope thereof, it is to be understood that all matter herein set forth or shown in the accompanying drawings is to be interpreted as illustrative and not in a limiting sense.

Having thus described the invention, we claim:

1. A method of registering a pair of color separation films containing halftone dot detail, said method comprising the steps of:
   selecting one of the films as a reference film;
   selecting first and second spaced apart locations on the reference film;
   recording first and second pictures of portions of said reference film which are substantially centered at the respective first and second locations;
   recording third and fourth pictures of portions of the other film centered at locations thereon which approximately correspond to but may be offset from the respective first and second locations;
   analyzing each of said pictures to obtain a picture analysis therefrom; and
   using the picture analyses to assist correlating said pictures to determine the translational movement necessary to obtain registration of the first and third pictures and the second and fourth pictures.

2. A method of registering a pair of color separation films containing halftone dot detail, said method comprising the steps of:
   selecting one of the films as a reference film;
   selecting first and second spaced apart locations on the reference film;
   recording first and second digital pictures of portions of said reference film which are substantially centered at the respective first and second locations;
   recording third and fourth digital pictures of portions of the other film centered at locations thereon which approximately correspond to but may be offset from the respective first and second locations;
   analyzing each of said digital pictures;
   computing the translational movement necessary to obtain registration of the first and third digital pictures; and
   computing the translational movement necessary to obtain registration of the second and fourth digital pictures.

3. The method of claim 2, wherein:
   each film may have one or more register marks each having a center located outside of the halftone dot detail on the film; and
   said analyzing and computing steps comprise
   (i) if the first and third digital pictures contain register marks, locating the centers of the marks and computing the translational movement required to register the centers;
   (ii) if the first and third digital pictures contain halftone dot detail rather than register marks, constructing digital registration pictures from the halftone dot detail and computing the translational movement required to register the registration pictures;
   (iii) if the second and fourth digital pictures contain register marks, locating the centers of the marks and computing the translational movement required to register the centers;
   (iv) if the second and fourth digital pictures contain halftone dot detail rather than register marks, constructing digital registration pictures from the halftone dot detail and computing the translational movement required to register the registration pictures.

4. The method of claim 3, wherein:
   each registration mark comprises a cross which includes two crossing bars in one digital tone on a background having another digital tone, said bars having four exterior points of intersection; and
   each step of locating the center of a register mark comprises the step of locating each of said four points and the step of computing the average of the four points to compute the mark center.

5. The method of claim 4, wherein the step of locating each of said four points comprises the steps of:
   scanning the digital picture in a preselected direction and locating the shortest runs of pixels in said preselected direction which begin with pixels having the digital tone of the crossing bars, then comprise pixels having the digital tone of the background, and terminate with pixels having the digital tone of the bars, thereby locating two of said four points; and
   scanning the digital picture in a direction normal to said preselected direction and locating the shortest runs of pixels in said normal direction which begin with pixels having the digital tone of the crossing bars, then comprise pixels having the digital tone of the background, and terminate with pixels having the digital tone of the bars, thereby locating the other two points.

6. The method of claim 5, wherein the step of locating each of said four points comprises the following steps if shortest runs of pixels are not located by the steps of scanning in said preselected direction and in said normal direction:
   scanning the digital picture in a direction oblique to said preselected direction and locating the shortest runs of pixels in said oblique direction which begin with pixels having the digital tone of the crossing bars, then comprise pixels having the digital tone of the background, and terminate with pixels having the digital tone of the bars, thereby locating two of said four points; and scanning the digital picture in a direction perpendicular to said oblique direction and locating the shortest runs of pixels in said perpendicular direction which begin with pixels having the digital tone of the crossing bars, then comprise pixels having the digital tone of the background, and terminate with pixels having the digital tone of the bars, thereby locating the other two points.

7. The method of claim 3, wherein the step of constructing digital registration pictures from the halftone dot detail comprises the steps of:

optimally thresholding the raw data of the halftone dot detail to reduce the raw data to binary pictures containing reduced raw data;

extracting data from each binary picture; and using the extracted data to construct the registration pictures.

8. The method of claim 2, wherein the step of analyzing each of said digital pictures comprises for each digital picture the steps of:

optimally thresholding the raw data image of the digital picture to reduce the raw data image to a binary reduced raw data picture;

extracting data from said reduced raw data picture; and using the extracted data to construct a registration picture corresponding to each digital picture.

9. The method of claim 8, wherein said computing steps comprise the steps of:

computing the translational movement necessary to obtain registration of the registration pictures corresponding to said first and third digital pictures; and computing the translational movement necessary to obtain registration of the registration pictures corresponding to said second and fourth digital pictures.

10. The method of claim 8, wherein said step of extracting data comprises the steps of: extracting halftone screen angle data from said reduced raw data picture;

extracting from said reduced raw data picture data which reflects the average spacing between the centers of adjacent dots in the halftone dot detail; and extracting from said reduced raw data picture data which reflects the fractional area occupied by each halftone dot within the halftone dot cell which contains the dot.

11. The method of claim 8, wherein said step of extracting data comprises the step of locating centers of a plurality of data dots in the halftone detail which have centers cooperating to predict the halftone screen angle of the halftone detail and the average distance between adjacent dots in the halftone detail.

12. The method of claim 11, wherein the step of locating centers of data dots comprises the steps of:

scanning the reduced raw data picture to locate runs of pixels which begin with pixels having the digital tone opposite the tone of the dots, then comprise pixels having the digital tone of the dots, and terminate with pixels having said opposite digital tone;

computing the center of each run of pixels to establish an initial dot center;

rejecting each initial dot center located within a preselected radius of another previously established initial dot center if said other initial dot center is located on a longer run of pixels; and replacing each initial dot center located within said preselected radius of another later established initial dot center with said other initial dot center if said other initial dot center is located on a longer run of pixels.

13. The method of claim 12, including the steps of:

scanning in both directions along two mutually perpendicular lines from each remaining initial data dot center to locate runs of pixels which extend along mutually perpendicular chords of each data dot;

bisecting each chord; and computing the location of the intersection between the perpendicular bisectors of each pair of chords to thereby establish a final center for each data dot.

14. The method of claim 8, wherein the step of extracting data from said reduced raw data picture comprises the steps of:

locating the coordinates of the centers of a plurality of data dots in a first coordinate system;

selecting an origin data dot and another data dot;

assuming an initial screen angle based on the angle in said first coordinate system of a line extending between said origin data dot and said other data dot;

performing a square spiral search centered on said origin data dot in a second coordinate system which is rotationally offset from said first coordinate system by said initial screen angle, thereby locating the coordinates of the centers of potential data dots in said second coordinate system;

checking as to whether the coordinates of the center of each potential data dot in said second coordinate system transformed to the first coordinate system correspond within a prescribed distance to the coordinates of a data dot center in said first coordinate system;

using a least squares method of expressing the sum of the squared distances between each corresponding pair of data dot centers in the first and second coordinate system; and determining the screen angle which minimizes said sum.

15. The method of claim 14, wherein the step of extracting data from said reduced raw data picture further comprises the step of calculating the average distance between the centers of adjacent data dots.

16. The method of claim 15, wherein the step of extracting data from said reduced raw data picture further comprises:

counting the number of pixels in each halftone cell which have the digital tone of a halftone dot;

calculating the optical density of each halftone cell based on said counted number of pixels compared to the total number of pixels in the cell; and using said optical density of each cell to construct a continuous tone picture in which each cell has a tone based on the optical density thereof.

17. The method of claim 16, including the step of interpolating within said continuous tone picture in a manner to construct therefrom a registration picture in which each cell has a tone center and the adjacent tone centers are separated by a preselected distance.

18. The method of claim 17, including the step of enhancing the edges of the registration picture.

19. The method of claim 17, including the steps of:
brightening areas of the registration picture having edges which are substantially horizontal or substantially vertical; and
darkening areas of the registration picture having edges which are skewed from horizontal and from vertical.

20. The method of claim 18, wherein said enhancement step comprises the steps of:
constructing an edge enhancement mask;
convolving said mask with the registration picture in a manner to enhance the edges thereof; and
adding the enhancement constructed from the mask convolution to the original registration picture.

21. The method of claim 20, wherein the step of constructing an edge enhancement mask comprises the steps of:
differentiating a bicubic spline mathematical representation of the registration picture with a second derivative product operator;
normalizing the result of said differentiating step to obtain a normalized mask; and
smoothing the data of the normalized mask.

22. The method of claim 21, wherein said smoothing step comprises applying the Hamming data smoothing factor to the data of the normalized mask.

23. A method of registering a pair of color separation films containing halftone dot detail, said method comprising the steps of:
selecting one of the films as a reference film;
mounting said reference film on a reference carrier sheet;
mounting the other film on another carrier sheet in rough register with respect to the reference film when the reference and other carrier sheets are aligned;
recording first and second digital pictures of portions of said reference film centered at selected first and second spaced apart locations thereon;
recording third and fourth digital pictures of portions of said other film centered at locations thereon which correspond to but may be slightly offset from the respective first and second locations;
optimally thresholding the data of each digital picture to construct therefrom a binary picture containing reduced raw data;
extracting selected data from each binary picture;
using the selected data to construct a registration picture from each binary picture; and
punching a first pair of holes in said reference carrier sheet and a second pair of holes in said other carrier sheet at locations wherein the registration pictures corresponding to said first and third digital pictures are registered and the registration pictures corresponding to said second and fourth digital pictures are registered when said first pair of holes is aligned with said second pair of holes.

24. The method of claim 23, wherein said step of extracting selected data from each binary picture comprises:
calculating the halftone screen angle of each binary picture;
calculating the average spacing between the centers of adjacent dots in the halftone dot detail; and
calculating the fractional area occupied by each halftone dot within the halftone cell which contains the dot.

25. The method of claim 24, including the step of constructing a continuous tone picture having a plurality of tone cells each exhibiting a tone reflecting the fractional area occupied by the corresponding halftone dot within its halftone cell.

26. The method of claim 25, including the step of interpolating within each continuous tone picture in a manner to construct therefrom a registration picture having tone cells separated by a preselected distance center to center.

27. The method of claim 26, including the steps of:
brightening areas of the registration picture having edges which are substantially horizontal or substantially vertical; and
darkening areas of the registration picture having edges which are skewed from horizontal and from vertical.

28. A method of registering a pair of color separation films each containing halftone dots, said method comprising the steps of:
selecting first and second spaced apart register points on one of the films;
recording first and second digital pictures at the respective first and second register points;
forming in said one film first and second holes which are spaced apart a preselected distance;
recording third and fourth digital pictures at respective third and fourth points on the other film which approximately correspond thereon to the locations of the respective first and second register points on said one film;
extracting selected data from said digital pictures;
calculating on the basis of said selected data third and fourth hole locations on said other film which, when aligned with the respective first and second holes, registers said first and third digital pictures and said second and fourth digital pictures; and
forming in said other film third and fourth holes at the respective third and fourth hole locations, whereby alignment of the first and third holes concurrently with alignment of the second and fourth holes effects registration of the films.

29. In a process of analyzing a digital picture having a registration mark formed by two crossing bars in one digital tone on a background in a contrasting digital tone, a method of locating the center of the registration mark comprising the steps of:
scanning the picture in a preselected direction and in a direction normal to said preselected direction;
locating the shortest runs of pixels in said preselected direction and, in said normal direction which begin with pixels having said one digital tone, then comprise pixels having said contrasting digital tone, and terminate with pixels having said one tone, thereby locating four exterior points of intersection of said crossing bars; and
locating the geometric center of said four points to locate the center of the registration mark.

30. The method of claim 29, including the following steps if shortest runs of pixels are not located by said run locating step:
scanning the picture in a direction oblique to said preselected direction and in a direction perpendicular to said oblique direction; and locating the shortest runs of pixels in said oblique direction and in said perpendicular direction which begin with pixels having said one tone, then comprise pixels having said contrasting tone, and terminate with pixels having said one tone, thereby locating said four points.

31. In a process of analyzing a digital picture of a color separation film containing halftone dot detail for purposes of registration with another film, a method of constructing a registration picture from said digital picture comprising the steps of:

optimally thresholding the raw data image of the digital picture to construct therefrom a binary picture containing reduced raw data;

calculating the halftone screen angle of the binary picture;

calculating the average spacing between the centers of adjacent dots in the binary picture;

calculating the fractional area occupied by each dot within a halftone cell which contains the dot and which is bounded by four sides each having a length equal to said average spacing;

constructing a continuous tone picture having said screen angle and said average spacing between centers of tone cells in the continuous tone picture, each tone cell having a tone based on the fractional area occupied by the corresponding dot in its halftone cell; and interpolating within said continuous tone picture in a manner to effect a preselected center to center spacing of the tone cells, thereby constructing the registration picture.

32. In a process of analyzing a digital picture of a color separation film containing halftone dots in one tone on a background in a contrasting tone, a method of locating the centers of dots comprising the steps of:

scanning the digital picture to locate runs of pixels which begin with pixels having said contrasting tone, then comprise pixels having said one tone, and terminate with pixels having said contrasting tone;

computing the center of each run of pixels to establish an initial dot center;

rejecting each initial dot center located within a preselected radius of another previously established initial dot center if said other initial dot center is located on a longer run of pixels;

replacing each initial dot center located within each preselected radius of another later established initial dot center with said later established initial dot center if said later established initial dot center is located on a longer run of pixels;

scanning from each remaining initial dot center along two mutually perpendicular lines to locate runs of pixels which extend along mutually perpendicular chords of each data dot; and locating the intersection between perpendicular bisectors of each pair of chords to thereby establish the location of a final center for each dot.

33. A machine for use in registering color separation films containing halftone dots, said machine comprising:

a frame;

a digital camera operable to record first and second digital pictures centered at spaced apart first and second locations on one of the films and first and second digital pictures centered at approximately corresponding locations on each of the other films;

means for analyzing each of said first digital pictures and calculating the movement necessary for each of said other films to effect registration of the first digital picture thereof with the first digital picture of said one film; and means for analyzing each of said second digital pictures and calculating the movement necessary for each of said other films to effect registration of the second digital picture thereof with the second digital picture of said one film.

34. The machine of claim 33, wherein each analyzing means for said first and second digital pictures comprises:

means for optimally thresholding the data of each digital picture to reduce the data to a binary picture containing reduced raw data;

means for extracting selected data from each binary picture; and means for constructing a registration picture from the selected data extracted from each binary picture.

35. The machine of claim 34, including means for punching first and second holes in each color separation film at locations which effect registration of all films when the first and second holes of each film are aligned with the first and second holes of all other films.

36. The machine of claim 35, wherein said punching means includes a single punch mounted on the frame and operable to punch a hole in each film at a location thereon aligned with the punch.

37. The machine of claim 34, wherein:

said selected data includes halftone screen angle data, average interdot spacing data and fractional dot data reflecting the fractional area occupied by each dot within a square halftone dot cell centered on the dot and having sides equal in length to said average interdot spacing; and said constructing step comprises constructing a continuous tone picture having tone cells oriented at said halftone screen angle and separated center to center by said average interdot spacing, each cell having a tone based on the fractional dot data of the corresponding halftone dot cell.

38. The machine of claim 37, including means for interpolating within each continuous tone picture in a manner to construct therefrom a corresponding registration picture having cells separated center to center by a preselected distance which differs from said average interdot spacing.

39. The machine of claim 38, including:

means for enhancing edges of the registration picture; and means for mapping the tones of the cells in the registration pictures of said other films into the tones of the cells in the registration pictures of said one film.

40. The machine of claim 33, including:

a punch mounted on the frame at a preselected location and operable when activated to punch holes in the films;

a movable chase for receiving and holding each of said films;

means for mounting said chase on the frame for movement through a range sufficient to carry the films into alignment with the punch;

means for effecting movement of said chase in a manner to align two selected punch locations on each film with the punch, said locations being selected in a manner to effect registration of the first and second pictures of each film when the corresponding locations of the films are aligned; and means for activating said punch each time one of said locations is aligned therewith.

41. A machine for use in registering a pair of color separation films each containing halftone dots, said machine comprising:
  a frame;
  a chase for receiving and retaining the films thereon in succession;
  means for mounting said chase on the frame in a manner permitting linear movement of the chase along two mutually perpendicular axes;
  punch means for punching holes in the films when activated;
  a digital camera operable when activated to record digital pictures;
  means for moving said chase with one film thereon to successive positions wherein first and second selected register points on said one film are aligned with the camera;
  means for activating said camera when said register points are aligned therewith, thereby recording first and second digital pictures at the respective first and second register points;
  means for aligning first and second punch hole locations on said one film with said punch means;
  means for activating said punch means to punch first and second holes in said one film at the respective first and second punch hole locations;
  means for moving said chase with the other film thereon to successive positions wherein alignment is achieved between the camera and third and fourth points on said other film which approximately correspond to the respective first and second register points;
  means for activating said camera when said third and fourth points are aligned therewith, thereby recording third and fourth digital pictures at the respective third and fourth points;
  means for extracting selected data from said digital pictures and using said data to calculate third and fourth punch hole locations on said other film which, when aligned with the respective first and second punch holes, effects registration between said first and third digital pictures and between said second and fourth digital pictures;
  means for aligning said third and fourth punch hole locations with said punch means; and
  means for activating said punch means to punch third and fourth holes in said other film at the respective third and fourth punch hole locations, whereby the films are registered when the punch holes are in alignment.

42. The machine of claim 41, wherein:
  said punch means comprises an extendable and retractable punch on the frame moving to an extended position when activated and to a retracted position when deactivated;
  said means for aligning said first and second punch hole locations with said punch means comprises means for moving said chase with said one film thereon to successive positions wherein said first and second punch hole locations are aligned with said punch;
  said means for aligning said third and fourth punch hole locations with said punch means comprises means for moving said chase with said other film thereon to successive positions wherein said third and fourth punch hole locations are aligned with said punch; and
  said activating means comprises means for moving said punch to the extended position each time one of the punch hole locations is aligned with the punch.

43. The machine of claim 41, wherein said extracting means comprises:
  means for optimally thresholding the data in each digital picture to reduce the picture to a binary picture containing reduced raw data;
  means for calculating the halftone screen angle from the reduced raw data;
  means for calculating from the reduced raw data the average spacing between the centers of the halftone dots;
  means for computing from the reduced raw data the fractional area occupied by each halftone dot within a square halftone cell containing the dot and having sides equal to said average spacing; and
  means for constructing a continuous tone picture having tone cells defining said screen angle and spaced apart center to center by said average spacing, each cell having a tone determined by said fractional area.

44. The machine of claim 43, including means for interpolating within each continuous tone picture to construct therefrom a registration picture in which tone cells are separated center to center by a preselected distance different from said average spacing.

45. The machine of claim 44, including means for enhancing edges of each registration picture.

46. The machine of claim 41, wherein said extracting means comprises:
  means for constructing a registration picture from each digital picture;
  means for calculating the movement of said other film necessary to register the registration pictures corresponding to said first and third digital pictures; and
  means for calculating the movement of said other film necessary to register the registration pictures corresponding to said second and fourth digital pictures.

* * * * *